(12) United States Patent
Huang et al.

(10) Patent No.: US 11,670,608 B2
(45) Date of Patent: Jun. 6, 2023

(54) PREVENTION OF METAL PAD CORROSION DUE TO EXPOSURE TO HALOGEN

(71) Applicant: Taiwan Semiconductor Manufacturing Co., Ltd., Hsin-Chu (TW)

(72) Inventors: Chih-Fan Huang, Kaohsiung (TW); Hui-Chi Chen, Hsinchu County (TW); Chih-Sheng Li, Hsinchu (TW); Chih-Hung Lu, Hsinchu County (TW); Dian-Hau Chen, Hsinchu (TW); Yen-Ming Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/936,910

(22) Filed: Jul. 23, 2020

(65) Prior Publication Data
US 2021/0098399 A1 Apr. 1, 2021

Related U.S. Application Data

(60) Provisional application No. 62/907,360, filed on Sep. 27, 2019.

(51) Int. Cl.
*H01L 23/00* (2006.01)
*H01L 21/02* (2006.01)

(52) U.S. Cl.
CPC ........ *H01L 24/05* (2013.01); *H01L 21/02274* (2013.01); *H01L 21/02315* (2013.01);
(Continued)

(58) Field of Classification Search
CPC ......... H01L 24/03; H01L 24/05; H01L 24/11; H01L 24/12; H01L 24/13; H01L 24/14; H01L 24/15; H01L 24/16; H01L 24/17; H01L 2224/0519; H01L 2224/81; H01L 2224/73265; H01L 2224/1058; H01L 23/5223; H01L 2224/05569; H01L 2224/05008; H01L 2224/08135; H01L 2224/0812; H01L 2224/08123; H01L 2224/80895; H01L 2224/80896;
(Continued)

(56) References Cited

U.S. PATENT DOCUMENTS 7,576,014 B2 * 8/2009 Miyake ............. H01L 21/76837
438/778
7,635,643 B2 * 12/2009 Daubenspeck ......... H01L 24/05
257/738
(Continued)

*Primary Examiner* — Khiem D Nguyen
(74) *Attorney, Agent, or Firm* — Haynes and Boone, LLP

(57) ABSTRACT

Semiconductor devices, integrated circuits and methods of forming the same are provided. In one embodiment, a method includes depositing a first dielectric layer over a metal pad disposed over a workpiece, forming a first opening in the first dielectric layer to expose a portion of the metal pad, after the forming of the first opening, forming a second dielectric layer over the exposed portion of the metal pad, depositing a first polymeric material over the second dielectric layer, forming a second opening through the first polymeric material and the second dielectric layer to expose the metal pad, and forming a bump feature over the exposed metal pad.

20 Claims, 21 Drawing Sheets

(52) U.S. Cl.
CPC .............. *H01L 24/03* (2013.01); *H01L 24/11* (2013.01); *H01L 24/13* (2013.01); *H01L 2224/0519* (2013.01)

(58) Field of Classification Search
CPC . H01L 2224/08268; H01L 2224/08148; H01L 2224/08151; H01L 2224/141; H01L 2224/14183; H01L 2224/1601; H01L 2224/16014; H01L 2224/1605; H01L 2224/1607; H01L 23/02315; H01L 23/3192; H01L 28/60
USPC .................. 438/612, 613; 257/E21.24, 758
See application file for complete search history.

(56) References Cited

U.S. PATENT DOCUMENTS

| | | | | |
|---|---|---|---|---|
| 8,865,585 | B2 * | 10/2014 | Chou | H01L 24/03 438/612 |
| 9,024,431 | B2 * | 5/2015 | Liu | H01L 23/5226 257/692 |
| 9,337,118 | B2 | 5/2016 | Wang et al. | |
| 9,418,948 | B2 * | 8/2016 | Chuang | H01L 24/05 |
| 9,773,732 | B2 | 9/2017 | Chen et al. | |
| 9,997,482 | B2 * | 6/2018 | Lee | H01L 24/05 |
| 10,157,871 | B1 * | 12/2018 | Yu | H01L 21/568 |
| 10,522,488 | B1 * | 12/2019 | Chen | H01L 23/3142 |
| 2005/0191836 | A1 * | 9/2005 | Tzeng | H01L 21/56 257/E21.576 |
| 2010/0184285 | A1 * | 7/2010 | Hua | H01L 24/03 257/E21.24 |
| 2011/0156253 | A1 * | 6/2011 | Tsai | H01L 24/11 257/737 |
| 2011/0186988 | A1 * | 8/2011 | Chen | H01L 24/27 257/737 |
| 2012/0032322 | A1 * | 2/2012 | Lin | H01L 24/17 257/737 |
| 2014/0103532 | A1 * | 4/2014 | Huang | H01L 21/76834 257/773 |
| 2014/0264890 | A1 * | 9/2014 | Breuer | H01L 24/13 257/773 |
| 2015/0102487 | A1 * | 4/2015 | Wang | H01L 24/13 257/737 |
| 2016/0086901 | A1 * | 3/2016 | Huang | H01L 23/49838 257/686 |
| 2016/0118360 | A1 * | 4/2016 | Wu | H01L 24/33 257/737 |
| 2017/0092597 | A1 * | 3/2017 | Jeng | H01L 23/564 |
| 2017/0288032 | A1 * | 10/2017 | Lu | H01L 21/31111 |
| 2018/0211912 | A1 * | 7/2018 | Yu | H01L 23/49827 |
| 2019/0139784 | A1 * | 5/2019 | Lin | H01L 23/49838 |

* cited by examiner

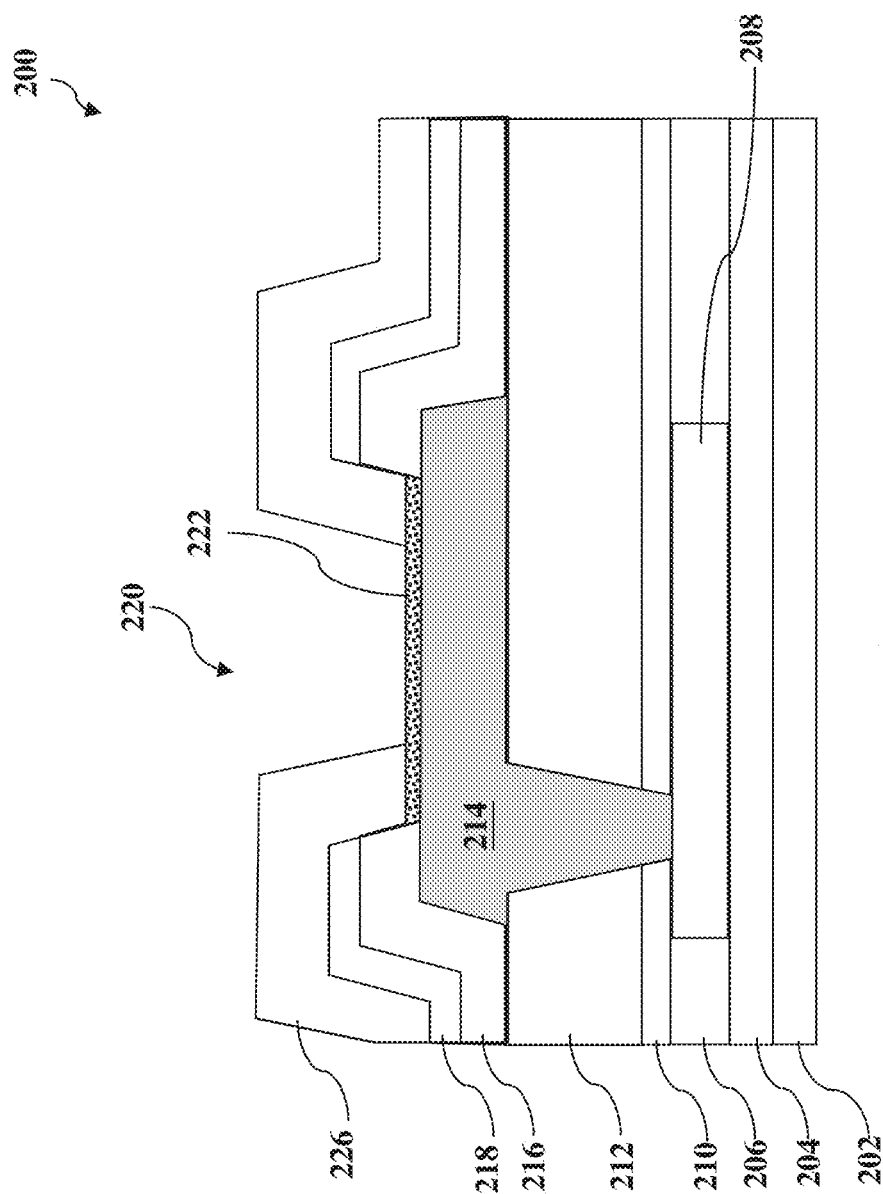

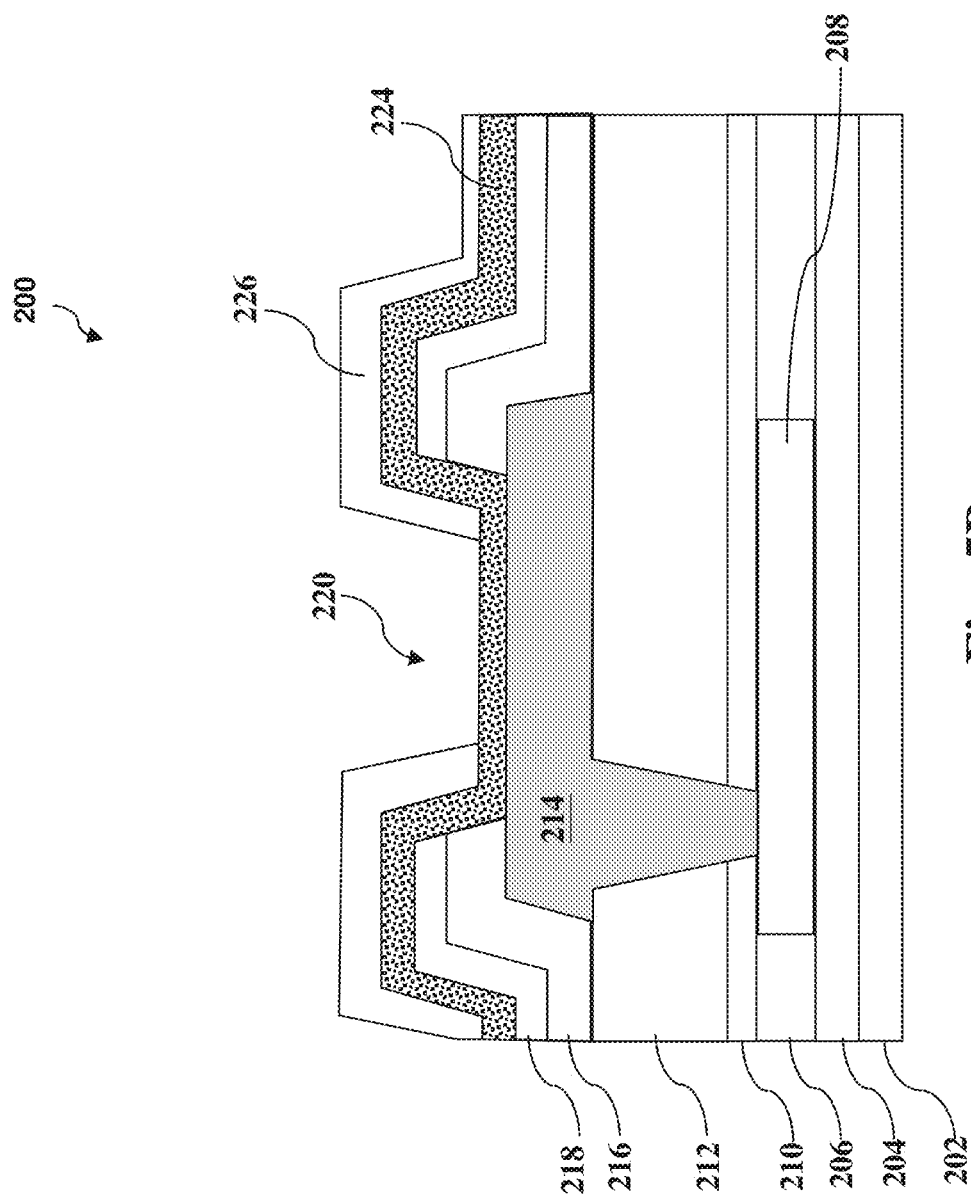

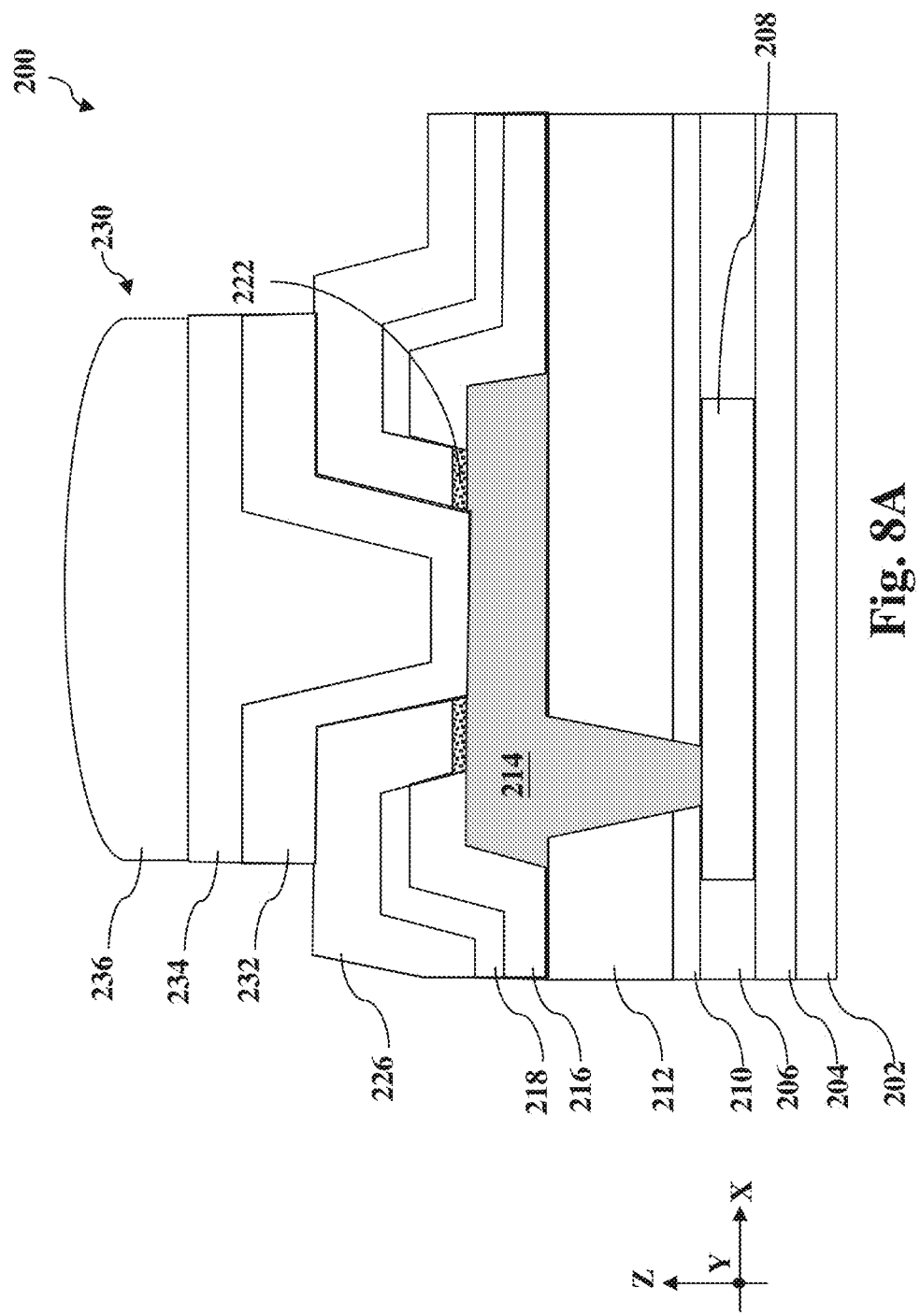

PREVENTION OF METAL PAD CORROSION DUE TO EXPOSURE TO HALOGEN

PRIORITY DATA

This application claims priority to U.S. Provisional Patent Application Ser. No. 62/907,360 filed Sep. 27, 2019, and entitled "Novel Protection Layer Structures," the entire disclosure of which is hereby incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

For example, ICs are formed on a semiconductor substrate that may be cut into individual device dies or IC chips. Each IC chip may be further attached (such as by bonding) to an interposer, a reconstituted wafer, or another die to form a package or a device. To meet various routing needs, a redistribution layer (RDL) of conductive metal lines may be formed on an IC chip to reroute bond connections from the edge to the center of the chip, or generally to disperse bond connections to an area greater than that of the IC chip. One or more passivation layers may be implemented around the RDL and additional polyimide layers may be formed over the one or more passivation layers. Some polyimide layers include components that may be released during subsequent processes to corrode metal contact pad in the topmost RDL layer. Therefore, although existing RDL technologies have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3, 4A, 4B, 5A, 5B, 6A, 6B, 7A-7D, 8A-8D, and 9A-9D are cross-sectional views of a workpiece at various stages of fabrication according to embodiments of the present disclosure.

DETAILED DESCRIPTION

Figure 1:
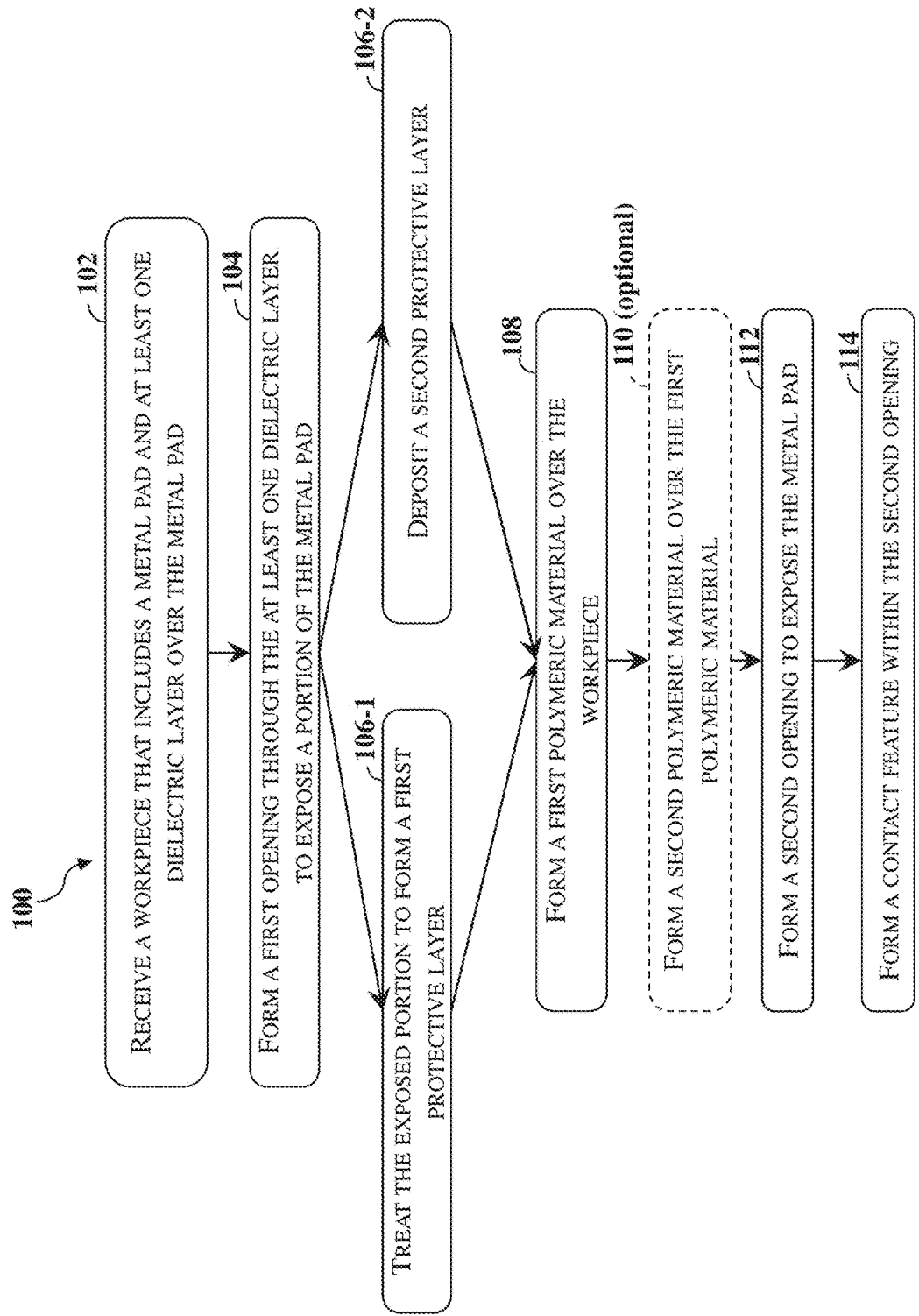
FIG. 1 is a flowchart of a method for fabricating a semiconductor device in accordance with embodiments of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

On many IC chips, a redistribution layer (RDL) of conductive metal lines is formed to reroute bond connections from the edge to the center of the chip or generally to distribute bond connections to an area larger than that of the IC chip. One or more passivation layers may be formed over the RDL to protect the semiconductor surface from electrical shorts, mechanical stresses and chemical contaminants. In some instances, one or more polyimide layers are formed over the one or more passivation layers. In some technology, the polyimide layers may be engineered to include halogenic components to improve various properties. For example, the polyimide layers may include fluorine or chlorine to improve patterning resolution at photolithography steps. These halogenic components may be released in a subsequent processing step that destructs the polymer backbone of the polyimide layer. When exposed to moisture, the released halogenic components may become hydrofluoric or hydrochloric acids that may attack the underlying contact pads of the RDL, such as an aluminum-containing pad, to cause undesirable corrosions.

Experiments have been conducted to verify release of halogenic components and metal pad corrosion thus resulted. In these experiments, two groups of samples are prepared. In the first group, a halogen-free polyimide material is deposited over an aluminum contact pad. In a second group, a fluorine-containing polyimide material is deposited over another aluminum contact pad. Except for the different polyimide materials, the two groups of samples undergo the same process steps. It has been observed that a polyimide ashing step destructs the polymer backbones of the fluorine-containing polyimide material, resulting in release of fluorine ions. In some instances, the fluorine ions come in contact with the aluminum contact pad and cause corrosion of the second aluminum contact pad. Specifically, the fluorine ions are observed to react with aluminum to form aluminum fluoride ($AlF_3$), which may react with aluminum oxide to form oxyaluminum fluoride ($Al_2O_3F_3$). The presence of aluminum fluoride and oxyaluminum fluoride results in increase of resistance. In some instances, the corrosion may continue until the exposed portion of the metal pad 214 is covered in a subsequent process.

To enjoy the benefits of having halogenic components in the polyimide layer and to protect the contact pad from corrosion, the present disclosure provides a method for forming a protective dielectric layer between the contact pad and the polyimide layer to prevent contact pad corrosion. In some embodiments, the protective dielectric layer may be formed by depositing a silicon oxide layer or a silicon nitride layer by plasma enhanced chemical vapor deposition (PECVD) or atomic layer deposition (ALD). In some other embodiments, the protective dielectric layer may be formed by treating the exposed contact pad with oxygen ($O_2$), nitrogen ($N_2$), or ammonia ($NH_3$) to form aluminum oxide or aluminum nitride. The protective dielectric layer functions to block fluorine or chlorine ions from coming in contact with the contact pad, thereby preventing contact pad corrosion.

The various aspects of the present disclosure will now be described in more detail with reference to the figures. In that regard, FIG. 1 is a flowchart illustrating a method 100 for fabricating a semiconductor device according to embodiments of the present disclosure. The method 100 is merely an example and is not intended to limit the present disclosure to what is explicitly illustrated in the method 100. Additional steps can be provided before, during, and after the method 100, and some steps described can be replaced, eliminated, or moved around for additional embodiments of the method 100. Not all steps are described herein in detail for reasons of simplicity. The method 100 is described below in conjunction with FIGS. 2, 3, 4A, 4B, 5A, 5B, 6A, 6B, 7A-7D, 8A-8D, and 9A-9D, which are diagrammatic fragmentary cross-sectional views of a workpiece 200 at different stages of fabrication according to embodiments of the present disclosure. Because a semiconductor device is to be fabricated from the workpiece 200, the workpiece 200 may be referred to as semiconductor device 200 in suitable context.

Figure 2:
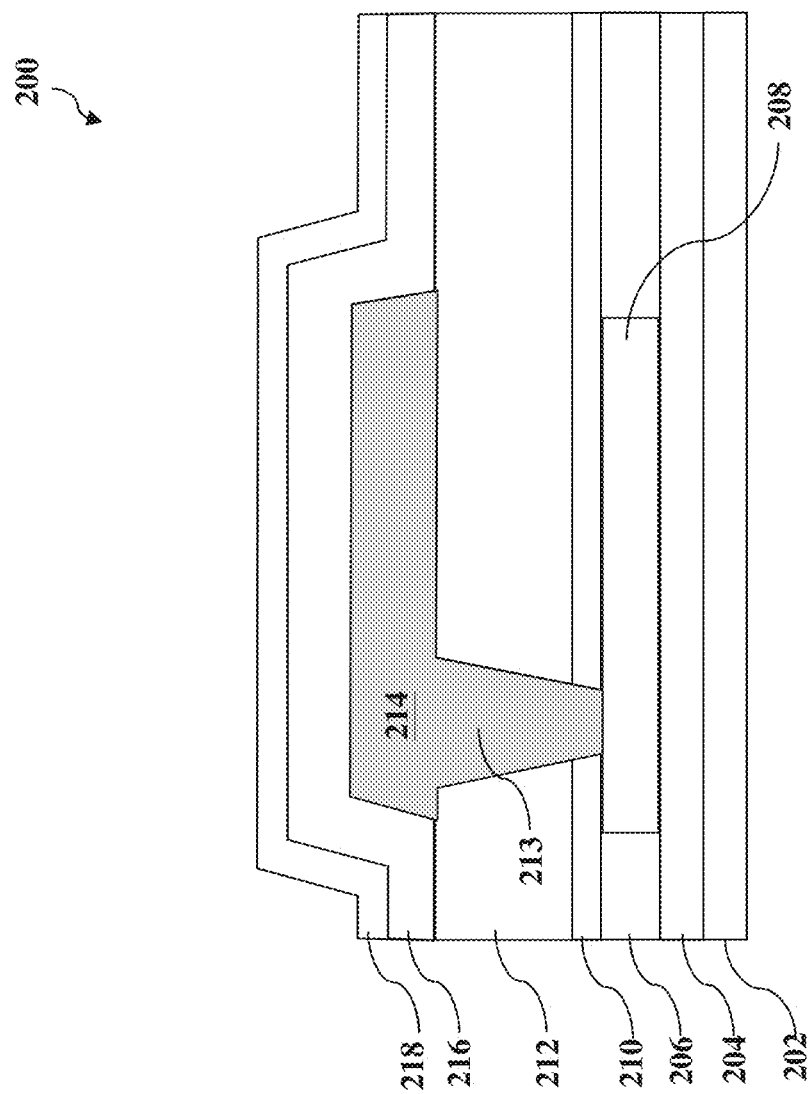

Referring now to FIGS. 1 and 2, method 100 includes a block 102 where a workpiece 200 is received. The workpiece 200 includes a metal pad 214 (or contact pad 214) and at least one dielectric layer over the metal pad 214. The workpiece 200 is provided with various layers already formed thereon. As shown in FIG. 2, the workpiece 200 includes a substrate 202, which may be made of silicon or other semiconductor materials such as germanium. Substrate 202 also may include a compound semiconductor such as silicon carbide, gallium arsenic, indium arsenide, or indium phosphide. In some embodiments, substrate 202 may include alloy semiconductor such as silicon germanium, silicon germanium carbide, gallium arsenic phosphide, or gallium indium phosphide. In some embodiments, substrate 202 may include an epitaxial layer, for example an epitaxial layer overlying a bulk semiconductor. Various microelectronic components may be formed in or on substrate 202, such as transistor components including source/drain and/or gate, isolation structures including shallow trench isolation (STI), or any other suitable components. Detailed illustrations of these various layers and features in substrate 202 are omitted.

The workpiece 200 also includes an interconnect layer 204. The interconnect layer 204 may be one of the interconnect layers in a multi-layered interconnect (MLI) structure, which is formed over the substrate 202 and may include multiple patterned dielectric layers and conductive layers that provide interconnections (e.g., wiring) between the various microelectronic components of the semiconductor device 200. There may be intermediate layers or components between the interconnect layer 204 and the substrate 202, but in the interest of simplicity, such layers or components are not shown. The interconnect layer 204 may include multiple conductive components as well as an interlayer dielectric (ILD) component that partially or fully surrounds the conductive components. The conductive components may include contacts, vias, or metal lines. The ILD component may be a silicon-containing dioxide material where silicon exists in various suitable forms. As an example, the ILD component includes silicon dioxide or a low-k dielectric material whose k-value (dielectric constant) is smaller than that of silicon dioxide, which is about 3.9. In some embodiments, the low-k dielectric material includes a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof. Some of the foregoing low-k dielectric materials may be referred to as extreme low-k (ELK) dielectric materials due to their low dielectric constants. The workpiece 200 includes a top interconnect layer 206 that includes a metal line 208. In some embodiments, the metal line 208 in the top interconnect layer 206 may be embedded in a dielectric material similar to the ILD component described above. To improve mechanical strength, the metal line 208 in the top interconnect layer 206 may be formed to a thickness that is greater than other metal lines in the interconnect layer 204. The metal line 208 may include copper and aluminum. In one example, the metal line 208 may be formed of an aluminum-copper alloy including 5% of copper and 95% of aluminum. Compared to a more conductive copper metal line, a metal line formed of the aluminum-copper alloy is more economical and adheres better to surrounding dielectric layers, such as those made of silicon oxide or silicon nitride. Although not shown, the top interconnect layer 206 may be lined with a barrier layer formed of titanium nitride, tantalum, tantalum nitride, or combinations thereof to block diffusion of copper, aluminum and oxygen.

In some embodiments, an etch stop layer (ESL) 210 is deposited on the top interconnect layer 206. The ESL 210 may include silicon carbon nitride (SiCN), silicon oxycarbide (SiOCN), silicon carboxide (SiC), or silicon nitride (SiN), or combinations thereof. A silicon oxide layer 212 may be deposited on the etch stop layer 210. In some embodiments, the silicon oxide layer 212 may be formed of undoped silica glass (USG) and may be referred to as USG layer 212. In some embodiments, a metal-insulator-metal (MIM) structure (such as the MIM structure 238 shown in FIGS. 9A-9D) may be formed in the silicon oxide layer 212. The MIM structure includes multiple metal layers interleaved with dielectric layers and functions as one or more capacitors. In some implementations, the multiple metal layers may include a top metal layer, a middle metal layer, and a bottom metal layer, each of which serves a capacitor plate. In some instances, to increase capacitance values, the dielectric layers in the MIM structure may include high-k dielectric material(s) whose k-value is greater than that of silicon dioxide. In some embodiments, the dielectric layers may include zirconium oxide ($ZrO_2$), aluminum oxide ($Al_2O_3$), or other high-k dielectric material, or a combination thereof.

The workpiece 200 also includes a contact via 213 and a metal pad 214. In some embodiments, the contact via 213 and metal pad 214 may be formed separately. In those embodiments, an opening is first formed within the silicon oxide layer 212 to expose a portion of the metal line 208 and a metal material is deposited in the opening. Excess metal material is then planarized by a suitable process, such as a chemical mechanical polishing (CMP), to provide a level surface. A dielectric layer is then deposited over the planarized surface of the silicon oxide layer 212 and photolithographically patterned to define a trench for the metal pad 214. An etch stop layer is first formed over the silicon oxide layer 212 and a dielectric layer is then deposited over the etch stop layer. A dual-damascene trench is then formed within the silicon oxide layer 212 and the dielectric layer. Afterwards, a metal material is then deposited in a bottom-up manner using electroplating, electroless plating, or other selective deposition processes. When an MIM structure is formed, the contact via 213 penetrates through the MIM structure. In some embodiments, metal pad 214 is an aluminum-containing metal pad that includes aluminum or an aluminum alloy. An example of the aluminum alloy includes aluminum and copper.

In some embodiments represented in FIG. 2, the metal pad 214 is a top layer of a redistribution layer (RDL) that reroute bond connections. Although not shown in FIG. 2, the metal pad may be lined by a barrier layer to isolate the metal pad from the adjacent dielectric layer, such as the silicon oxide layer 212.

At least one dielectric layer may be formed over the metal pad 214. In embodiments represented in FIG. 2, a first dielectric layer 216 is deposited over the workpiece 200 to cover the metal pad 214 and a second dielectric layer 218 is deposited over the first dielectric layers 216. In some implementations, the first dielectric layer 216 may include two sublayers that are formed using two different deposition processes. In one embodiment, the first dielectric layer 216 may include a bottom dielectric layer formed using undoped silica glass (USG) and a top dielectric layer formed using high-density plasma chemical vapor deposition (HDPCVD). In this embodiment, a deposition rate of the bottom dielectric layer using USG is greater than that of the top dielectric layer using HDPCVD and the deposition of the bottom dielectric layer reduces the thickness of the top dielectric layer, thereby increasing throughput and reducing fabrication cost of the semiconductor device 200. The second dielectric layer 218 may include silicon nitride and may be deposited using CVD.

Figure 3:
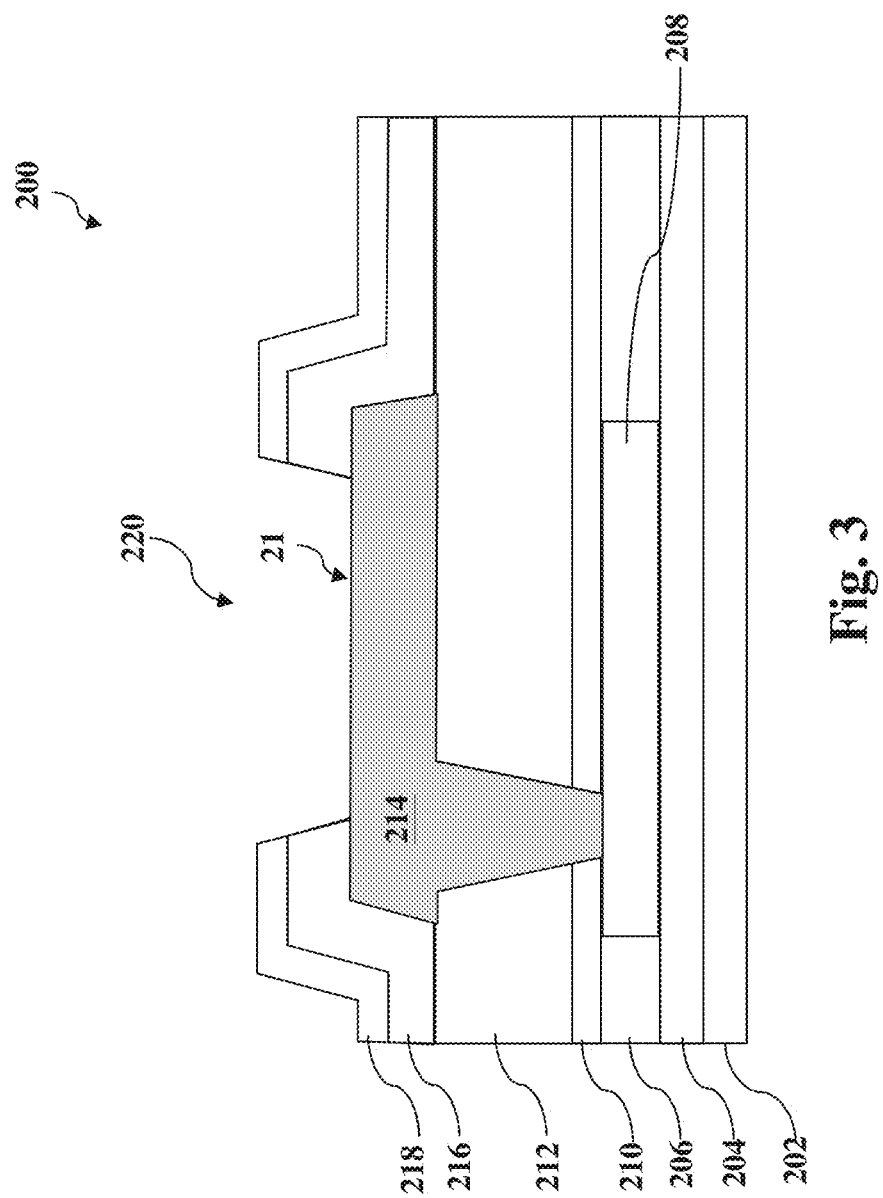

Referring to FIGS. 1 and 3, method 100 includes a block 104 where a first opening 220 is formed through the at least one dielectric layer to expose a first portion 21 of the metal pad 214. In some embodiments, once the first portion 21 of the metal pad 214 is exposed, wafer acceptance test may be performed to determine if the semiconductor device 200 is accepted based on a pre-determined test standard. Conventionally, after the wafer acceptance test is performed and the semiconductor device 200 is accepted, one or more polymeric passivation layers are deposited over the workpiece 200 to be in contact with the exposed first portion of the metal pad 214. When the one or more polymeric passivation layers include halogen components, the halogen component may be released and cause corrosion of the metal pad 214.

Figure 4A:
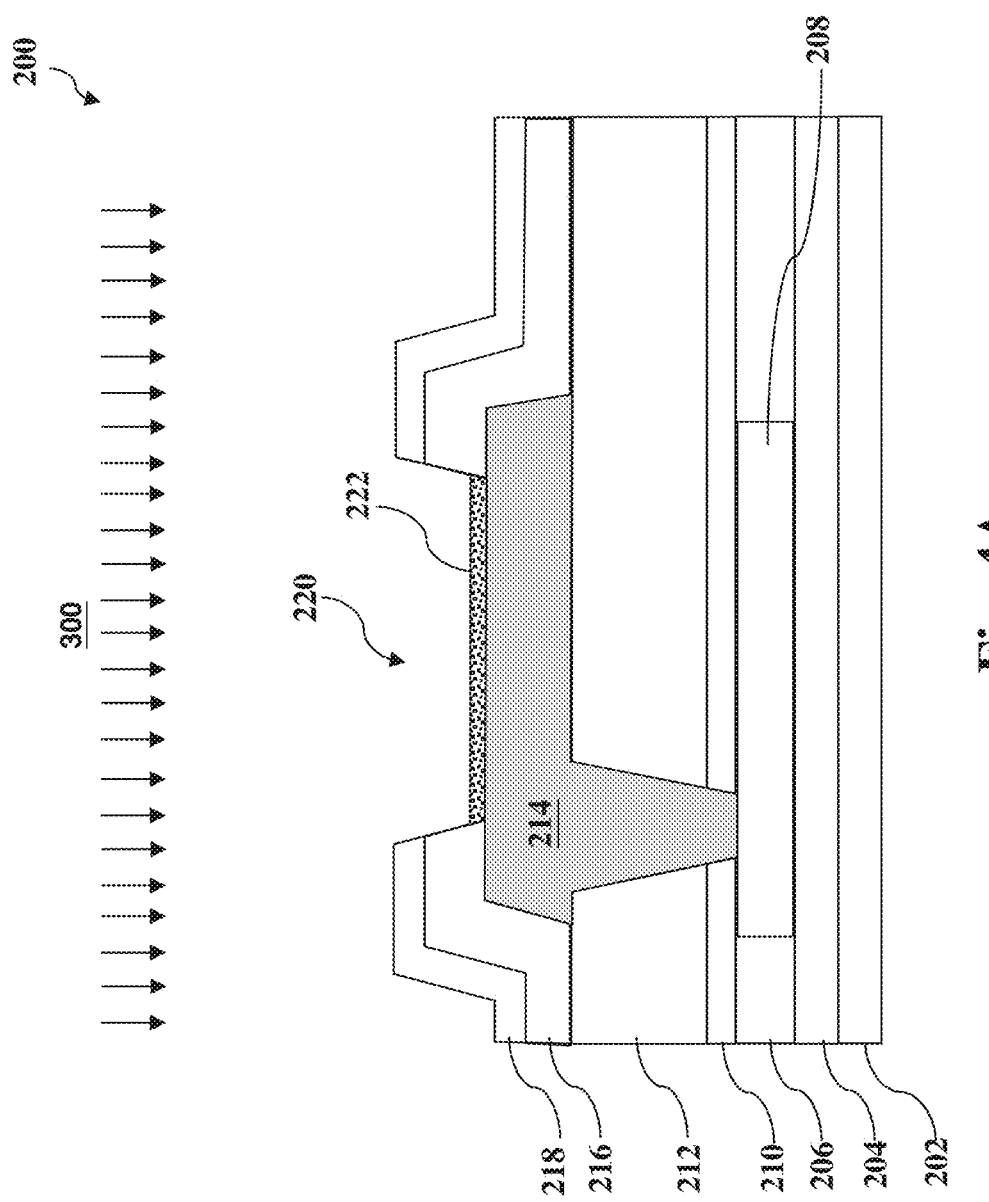

Method 100 in FIG. 1 may proceed either to block 106-1 or block 106-2 to form a protective layer in different embodiments. Referring now to FIGS. 1 and 4A, method 100 includes block 106-1 where the exposed first portion of the metal pad 214 is treated to form a first protective layer 222. At block 106-1, a treatment process 300 is performed to form the first protective layer 222. The treatment process 300 may include at least one reactive gas reactant, such as oxygen, nitrogen, ammonia, or a combination thereof. The treatment process 300 may be a plasma treatment process where plasma of the at least one reactive gas reactant is ignited. That is, an oxygen plasma, a nitrogen plasma, an ammonia plasma, or a combination thereof may be ignited over the workpiece 200 during the treatment process 300. In some other implementations, the treatment process 300 may include use of an inert gas, such as argon. In those other implementations, plasma of the inert gas species may be generated to bombard the surface of the metal pad 214 to facilitate reaction between the metal pad 214 and the at least one reactive gas reactant. In embodiments where the metal pad 214 includes aluminum, the first protective layer 222 formed at block 106-1 may include aluminum oxide or aluminum nitride. In embodiments where the metal pad 214 includes copper, the first protective layer 222 formed at block 106-1 may include copper oxide or copper nitride. In embodiments where the metal pad 214 includes both aluminum and copper, the first protective layer 222 may include oxides and nitrides of aluminum and copper. In some embodiments, the treatment process 300 is performed for a period of time such that the first protective layer 222 has a thickness between about 50 Å and about 200 Å to effectively prevent corrosion of the metal pad 214 due to halogen components released from subsequently formed polymeric material. When the thickness of the first protective layer 222 is less than 50 Å, the first protective layer 222 may not effectively block moisture from reaching into the metal pad 214. When the thickness of the first protective layer 222 is greater than 200 Å, the first protective layer 222 may not be completely removed by operations at block 112. The aluminum oxide or aluminum nitride residue may increase contact resistance (Rc) and degrade the device performance.

Figure 4B:
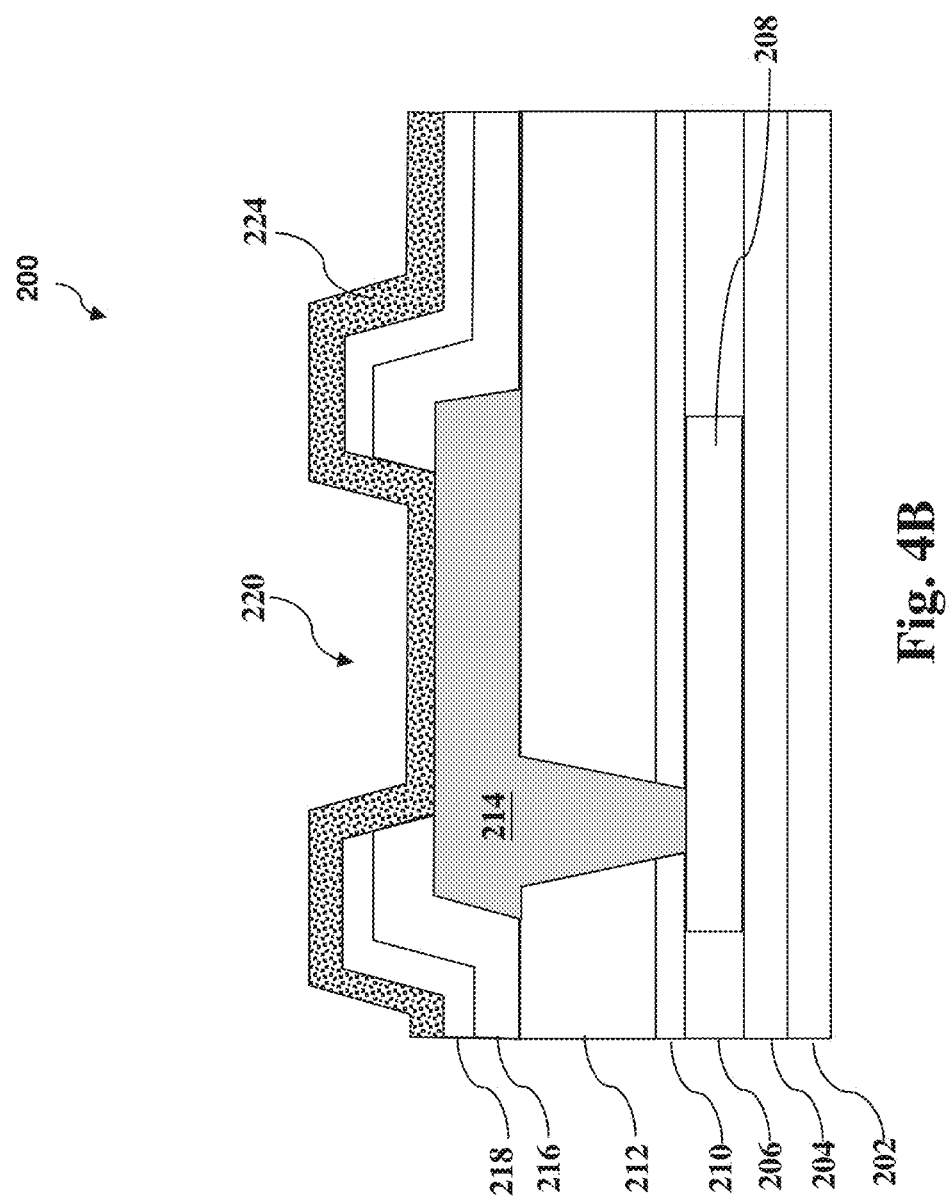

Referring to FIGS. 1 and 4B, method 100 alternatively may include block 106-2 where a second protective layer 224 is deposited over the workpiece 200, including over the exposed portion of the metal pad 214. In some embodiments, the second protective layer 224 may include semiconductor oxide or semiconductor nitride, such as silicon oxide or silicon nitride. The second protective layer 224 may be formed using a suitable conformal deposition method, such as ALD, CVD, or a plasma-enhanced chemical vapor deposition (PECVD). In one embodiment, the second protective layer 224 may be formed of silicon oxide and may be referred to as a silicon oxide cap. In another embodiment, the second protective layer 224 may be formed of silicon nitride and may be referred to as a silicon nitride cap. Experiments have established that the second protective layer 224 should have a thickness between about 50 Å and about 200 Å to effectively prevent corrosion of the metal pad 214 due to halogen components released from subsequently formed polymeric material. When the thickness of the second protective layer 224 is less than 50 Å, the second protective layer 224 may not effectively block moisture from reaching into the metal pad 214. When the thickness of the second protective layer 224 is greater than 200 Å, the second protective layer 224 may not be completely removed by operations at block 112. The silicon oxide or silicon nitride residue may increase contact resistance (Rc) and degrade the device performance.

Referring to FIGS. 1, 5A and 5B, method 100 includes a block 108 where a first polymeric material 226 is formed over the workpiece 200. The first polymeric material 226 also serves as a passivation layer. In some embodiments, the first polymeric material 226 may include halogen, such as fluorine or chlorine. In some implementations where more than one monomers are used to form the first polymeric material 226, at least one of the monomers includes fluorine or chlorine. In those implementations, fluorine or chlorine may be present in a suitable functional group. For example, at least one of the monomers to form the first polymeric material 226 may include one or more fluoroalkyl groups ($CF_x$, where x is 1, 2, or 3) or one or more chloroalkyl groups ($CCl_x$, where x is 1, 2, or 3). Examples of such monomers include 2,2-bis(3,4-dicarboxyphenyl) hexafluoropropane dianhydride (6FDA), 2,2-bis[4-(4-aminophenoxy)phenyl] hexafluoropropane (BDAF), 1,4-bis(4-amino-2-trifluoromethyl-phenoxy) benzene (6FAPB), 4,4'-bis(4-amino-2-trifluoro-methylphenoxy) biphenyl (6FBPB), other fluorinated dianhydride, or other fluorinated diamine. Inclusion of halogen changes properties of the first polymeric material 226. In some embodiments, inclusion of halogens improves resolution of a photolithography process to pattern the first polymeric material 226 and is therefore desirable. In one embodiment, the first polymeric material 226 include $CF_3$ functional group. In some embodiments illustrated in FIGS. 5A and 5B, the first polymeric material 226 is deposited over the workpiece 200 using spin-on coating or a suitable process. The first polymeric material 226 is then patterned by means of its sensitivity to radiation of a certain range of wavelength (e.g. ultraviolet (UV) radiation). The first polymeric material 226 is exposed to the radiation through a patterned mask. The first polymeric material 226 is then developed using a developer such that the exposed (or the non-exposed) portion of the first polymeric material 226 is removed by the developer. The exposed and developed first polymeric material 226 is then cured by annealing or exposure to UV. As patterned, the first polymeric material 226 does not cover a portion of the first protective layer 222 in FIG. 5A or the second protective layer 224 in FIG. 5B.

From block 108 onward, method 100 may either progress to block 110 to form a second polymeric material 228 or progress directly to block 112 without first performing operations at block 110. In that sense, block 110 is optional and may be omitted. The second polymeric material 228 may offer further protection and is desirable for semiconductor devices that require additional durability or weather resistance.

Figure 6A:
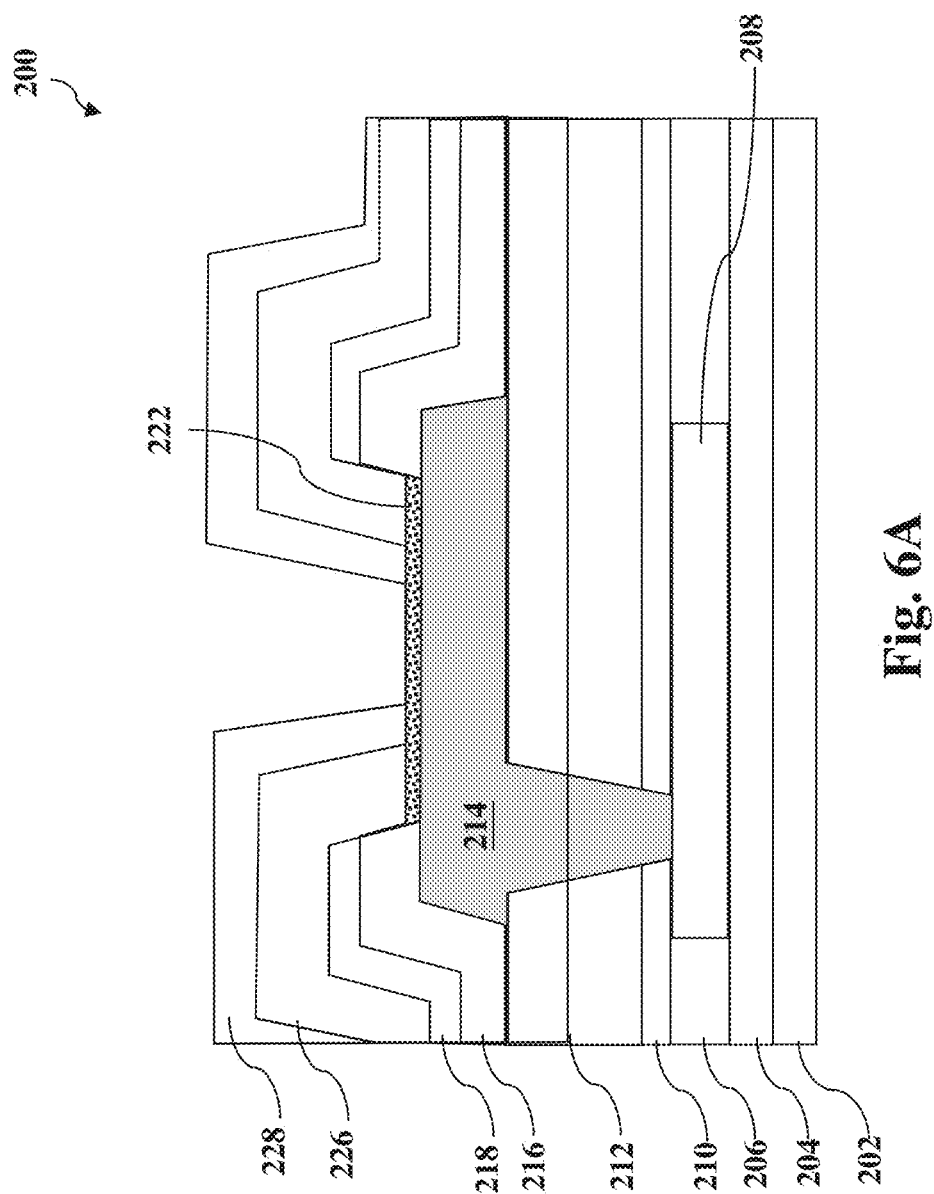
Figure 6B:
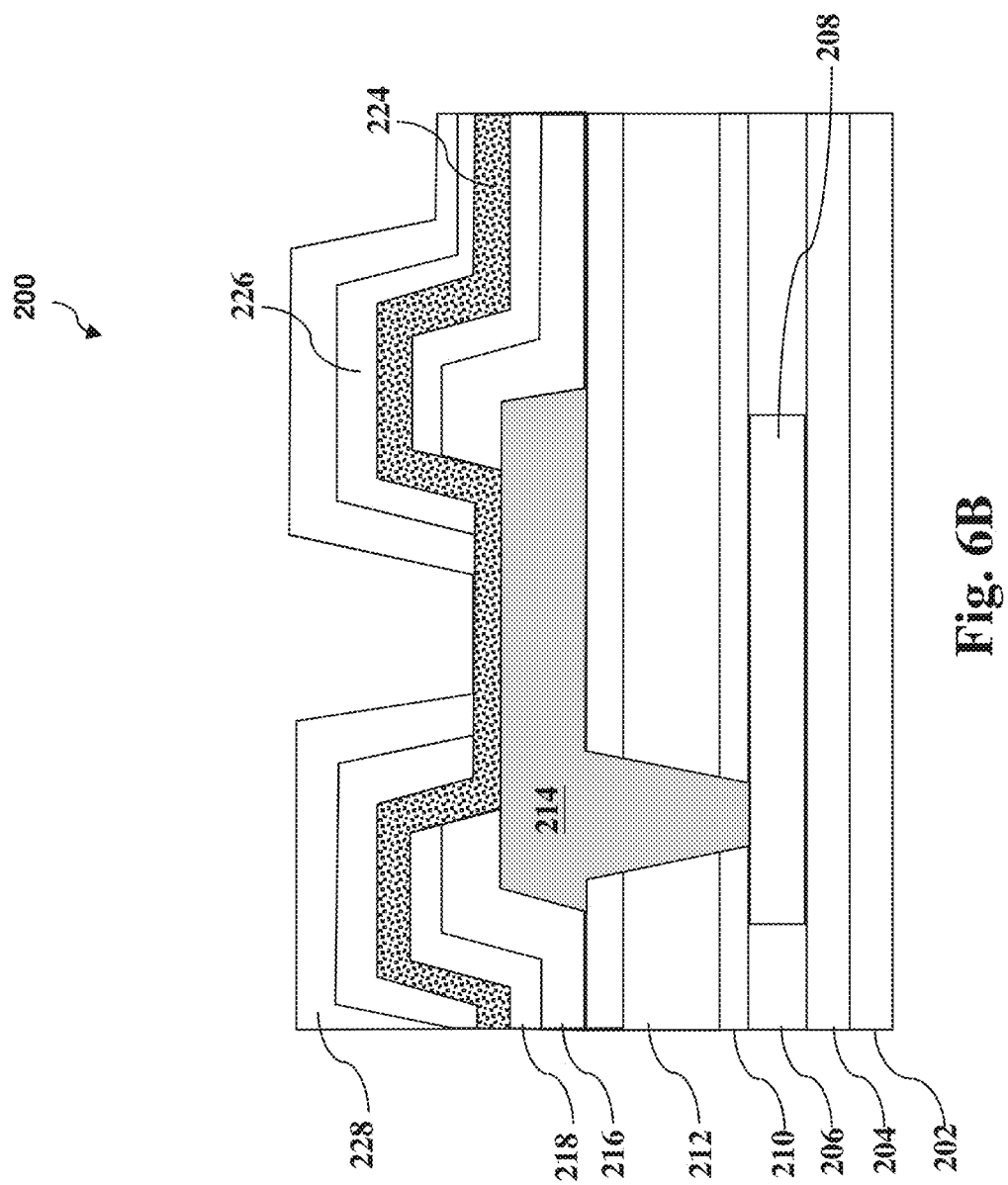
Figure 7A:
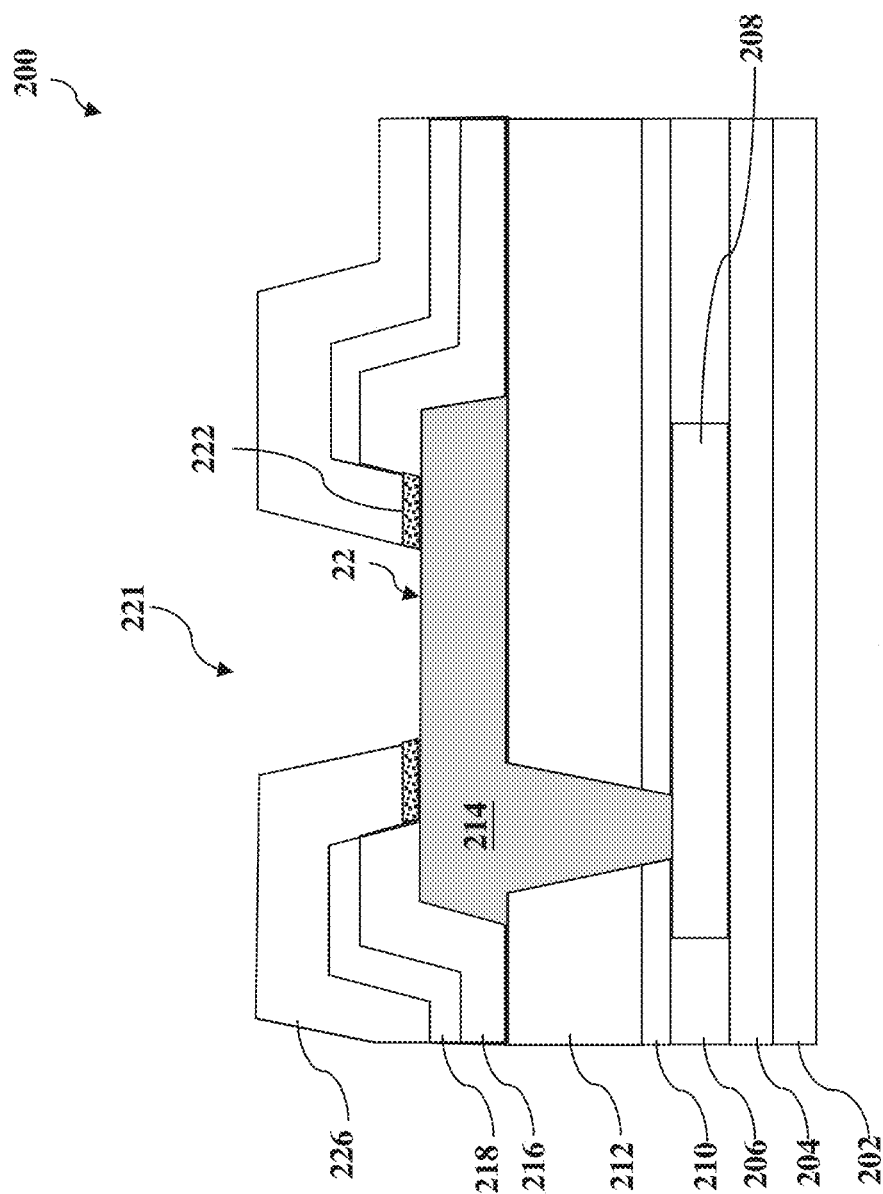
Figure 7B:
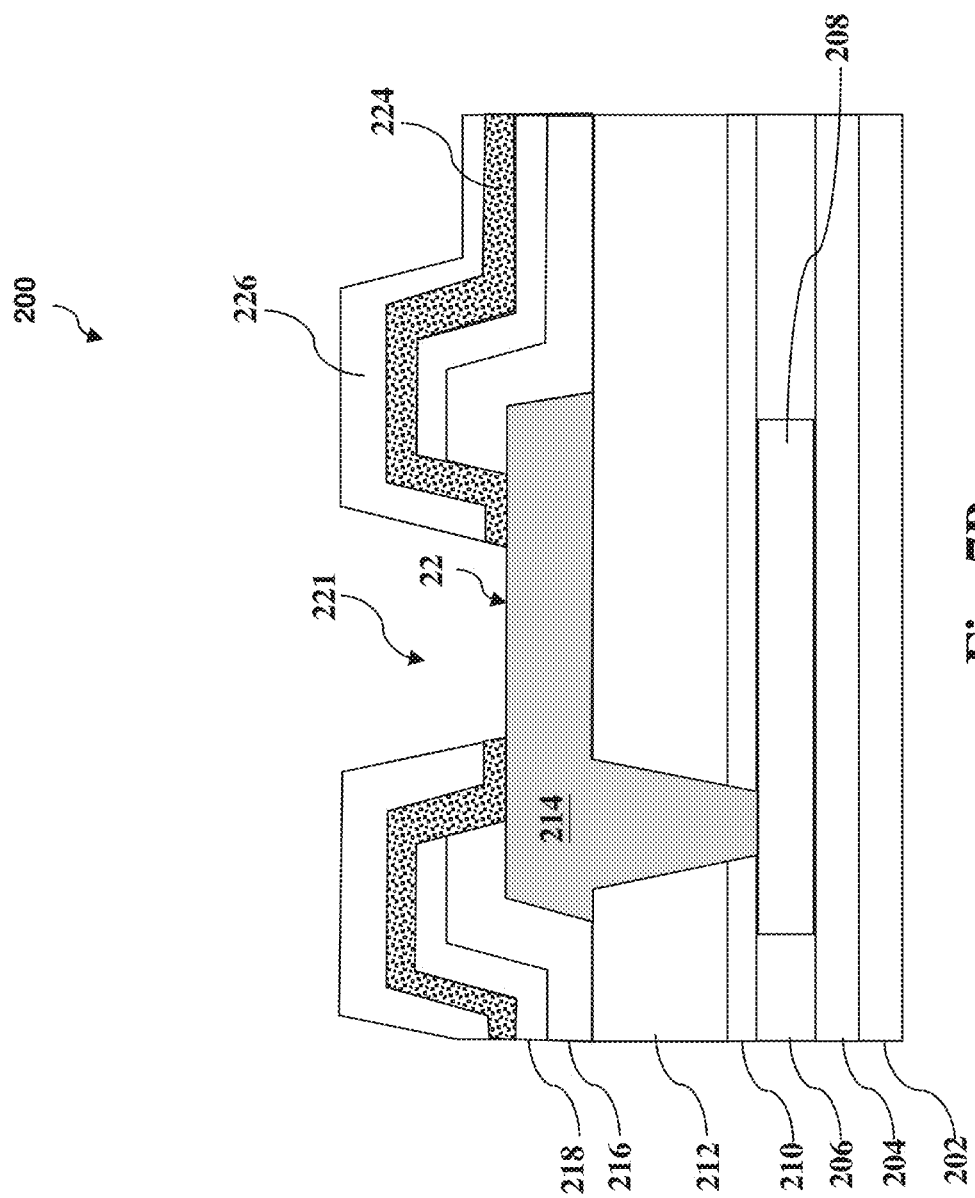
Figure 7C:
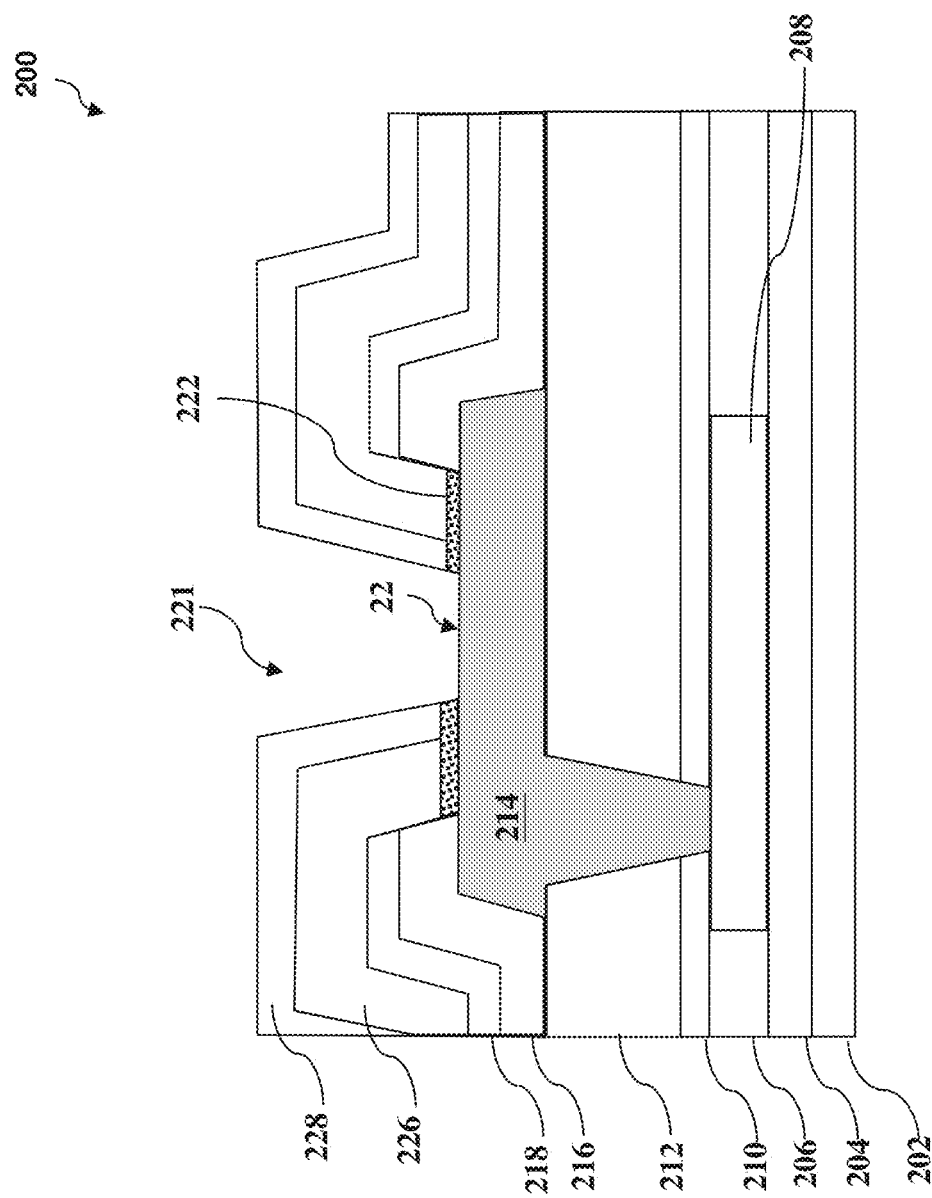
Figure 7D:
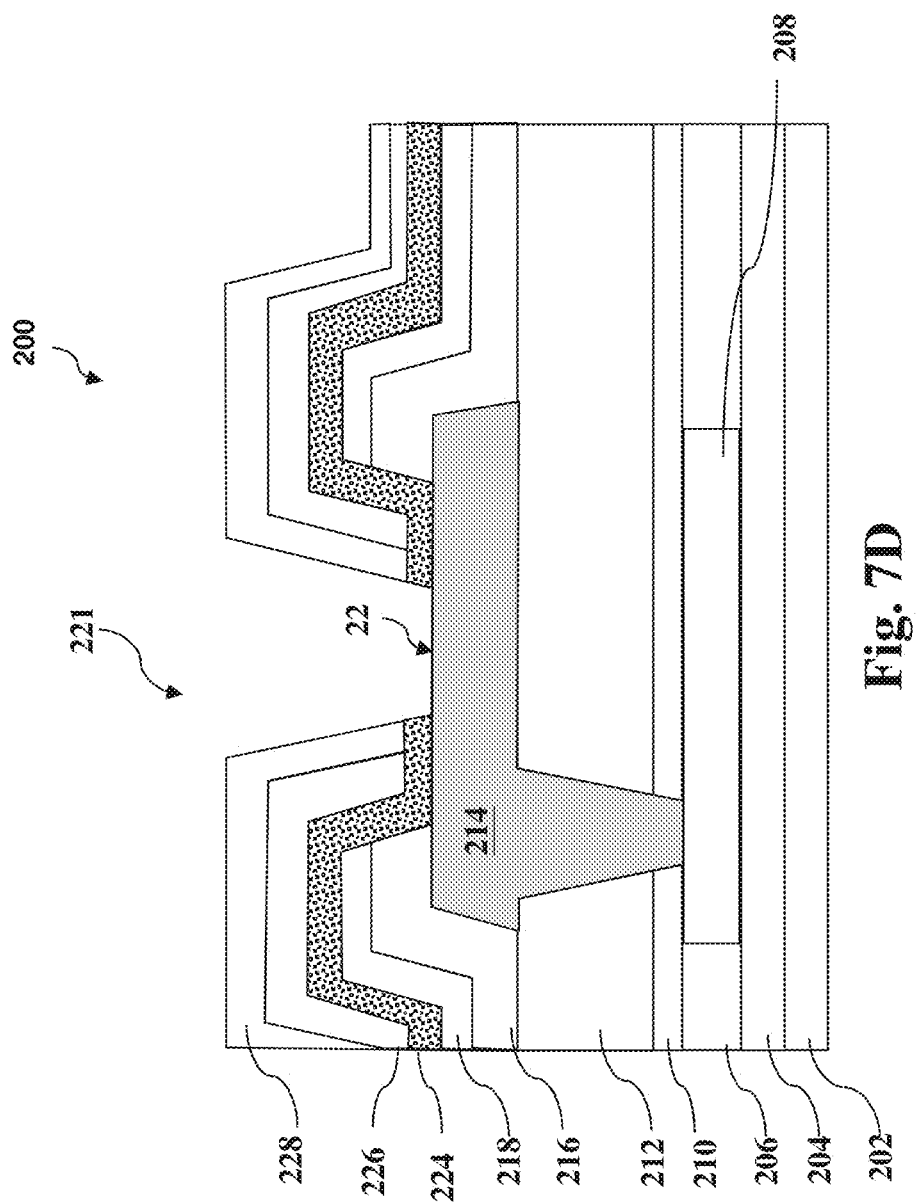

Referring to FIGS. 1, 6A and 6B, method 100 includes a block 110 where a second polymeric material 228 is optionally formed over the first polymeric material 226. The second polymeric material 228, like the first polymeric material 226, also serves as a passivation layer. In some embodiments, the second polymeric material 228 may include a halogen, such as fluorine or chlorine. In some implementations, at least one of the monomers to form the second polymeric material 228 includes fluorine or chlorine. In those implementations, fluorine or chlorine may be present in a suitable functional group. For example, at least one of the monomers to form the second polymeric material 228 may include one or more fluoroalkyl groups ($CF_x$, where x is 1, 2, or 3) or one or more chloroalkyl groups ($CCl_x$, where x is 1, 2, or 3). Examples of such monomers include 2,2-bis(3,4-dicarboxyphenyl) hexafluoropropane dianhydride (6FDA), 2,2-bis[4-(4-aminophenoxy)phenyl] hexafluoropropane (BDAF), 1,4-bis(4-amino-2-trifluoromethyl-phenoxy) benzene (6FAPB), 4,4'-bis(4-amino-2-trifluoro-methylphenoxy) biphenyl (6FBPB), other fluorinated dianhydride, or other fluorinated diamine. Inclusion of halogen changes properties of the second polymeric material 228. In some embodiments, inclusion of halogens improves resolution of a photolithography process to pattern the second polymeric material 228 and is therefore desirable. In one embodiment, the second polymeric material 228 include $CF_3$ functional group. In some embodiments illustrated in FIGS. 6A and 6B, the second polymeric material 228 is deposited over the workpiece 200, including over the first polymeric material 226, using spin-on coating or a suitable process. The second polymeric material 228 is then patterned by means of its sensitivity to radiation of a certain range of wavelength (e.g. ultraviolet (UV) radiation). The second polymeric material 228 is exposed to the radiation through a patterned mask. The second polymeric material 228 is then developed using a developer such that the exposed (or the non-exposed) portion of the second polymeric material 228 is removed by the developer. The exposed and developed second polymeric material 228 is then cured by annealing or exposure to UV. As patterned, the second polymeric material 228 does not cover a portion of the first protective layer 222 in FIG. 6A or the second protective layer 224 in FIG. 6B.

It noted that throughout method 100, whether or not the second polymeric material 228 is deposited, either the first protective layer 222 or the second protective layer 224 isolates the first polymeric material 226 and/or the second polymeric material 228 from the metal pad 214, thereby preventing any halogen components in the first polymeric material 226 and/or the second polymeric material 228 from being in contact with the metal pad 214.

Referring to FIGS. 1 and 7A-7D, method 100 includes a block 112 where a second opening 221 is formed to expose a second portion 22 of the metal pad 214. In some embodiments, the second opening 221 may be formed by dry etching. In some instances, the dry etching may include use of nitrogen plasma, oxygen plasma, or both. In some implementations, deionized (DI) water or isopropyl alcohol (IPA) may be used in a scrubbing process to remove debris from the exposed second portion 22 of the metal pad 214. As shown in FIGS. 7A-7D, in methods according to the present disclosure, the metal pad 214 remains protected by the first protective layer 222 or the second protective layer 224 until formation of the second opening 221 at block 112. That way, the first protective layer 222 or the second protective layer 224 insulates the metal pad 214 from halogen released from the first polymeric material 226 and/or the second polymeric material 228 and moisture, before it is time to expose the second portion 22 for formation of bump features. As long as the metal pad 214 is protected by the first protective layer 222 or the second protective layer 224, the workpiece 200 (or semiconductor device 200) enjoys improved shelf-life or storage stability.

Referring to FIGS. 1 and 8A-8D, method 100 includes a block 114 where a bump feature 230 is formed within the second opening 221. The bump feature 230 functions to electrically couple the metal pad 214 to bonding pads of a die, a reconstituted wafer, a package, a printed circuit board (PCB). As illustrated in FIGS. 8A-8D, the bump feature 230 may include multiple layers, and its formation involves multiple processes. In some embodiments, an under-bump-metallization (UBM, or under-bump-metallurgy) layer 232 is deposited into the second opening 221 (shown in FIGS. 7A-7D) and on the exposed second portion 22 of the metal pad 214, a bump layer 234 is deposited over the UBM layer 232, and then a solder layer 236 is then formed on the bump layer 234 as a point of connection to external circuitry. In some implementations, to form the UBM layer 232, a seed layer (not shown) is blanketly deposited over the workpiece 200. A mask layer, such as a photoresist layer, is then deposited over the seed layer. The mask layer is then patterned to expose a portion of the seed layer over the second opening 221 (shown in FIGS. 7A-7D). The UBM layer 232 is then deposited on the exposed portion of the seed layer and within the patterned mask layer by electroless plating or electroplating. Thereafter, the bump layer 234 is deposited on the UBM layer 232 by electroless plating or electroplating. A solder layer 236 is then deposited on the bump layer 234. After the patterned mask layer is removed by, for example, ashing, the deposited solder layer 236 is reflowed into a desirable shape. In some instances, the seed layer may be formed of titanium (Ti), tantalum (Ta), copper (Cu), or a combination thereof and deposited using physical vapor deposition (PVD) or a suitable process. The UBM layer 232 and the bump layer 234 may include copper (Cu), titanium (Ti), nickel (Ni), cobalt (Co), or tantalum (Ta). In some instances, a copper content of the bump layer 234 is greater than a copper content of the UBM layer. Due to its copper content, the bump layer 234 may be referred to as a copper pillar. The solder layer 236 may be formed of lead-containing or lead-free materials, such as tin (Sn), silver (Ag), copper (Cu), zinc (Zn), indium (In), gold (Au), lead (Pb), bismuth (Bi), antimony (Sb), or an alloy thereof. In some embodiments not explicitly shown in FIGS. 8A-8D, a cap layer may be formed between the solder layer 236 and the bump layer 234 and such a cap layer may include at least one of nickel (Ni), gold (Au), silver (Ag), palladium (Pd), indium (In), cobalt (Co), nickel-palladium-gold (NiPdAu), nickel-gold (NiAu), other similar materials, or alloys thereof.

Figure 8B:
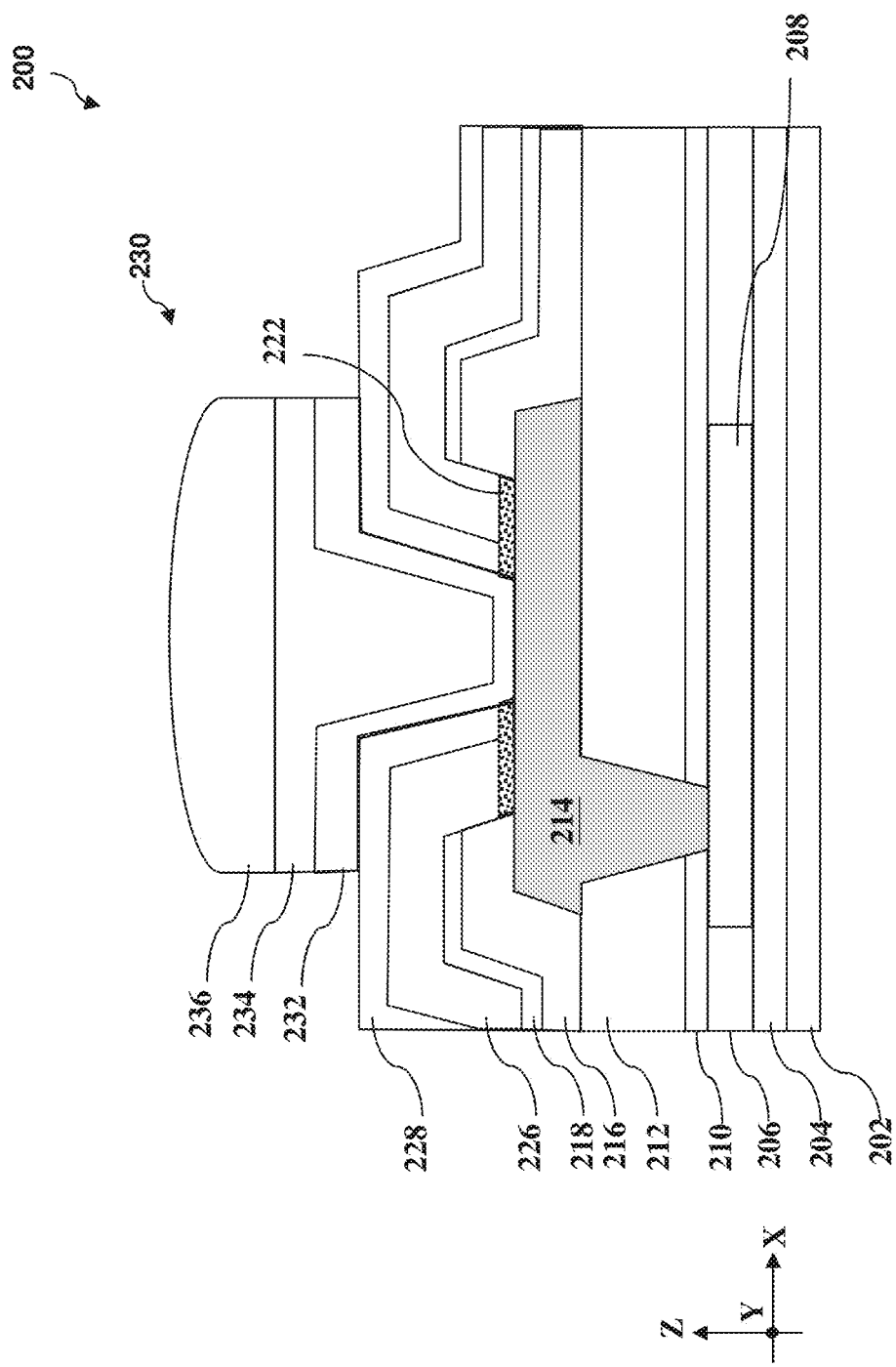
Figure 8C:
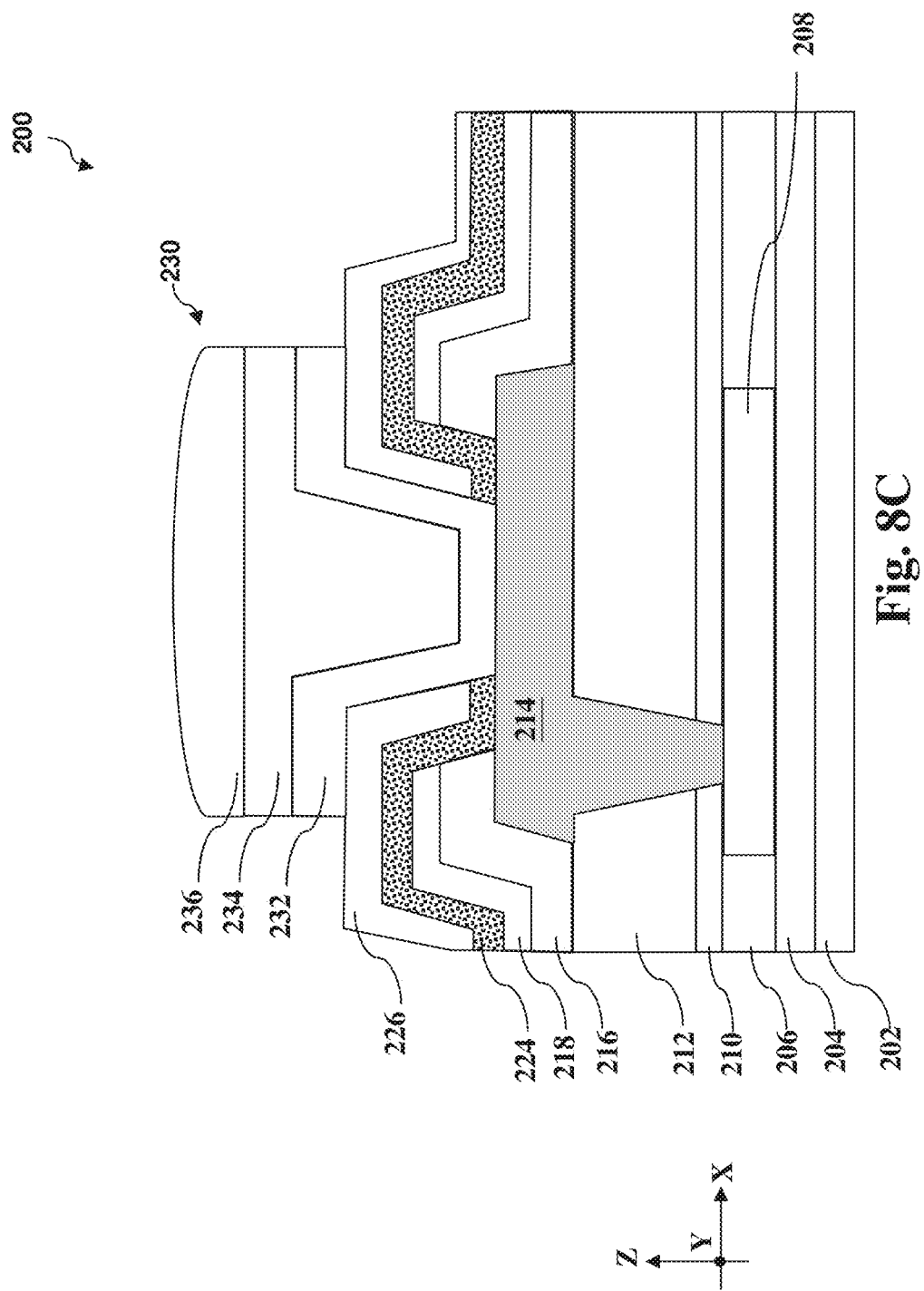
Figure 8D:
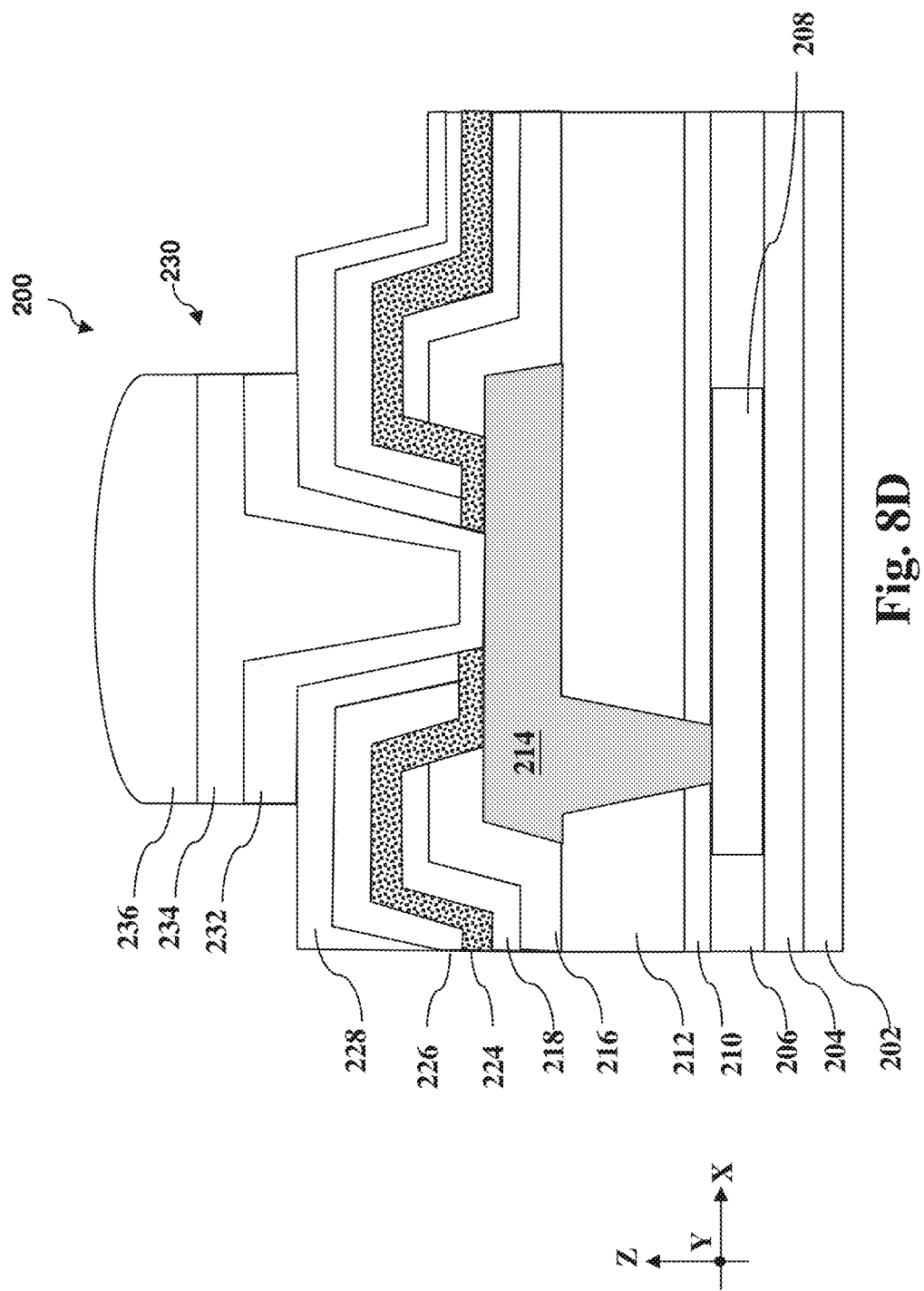
Figure 9A:
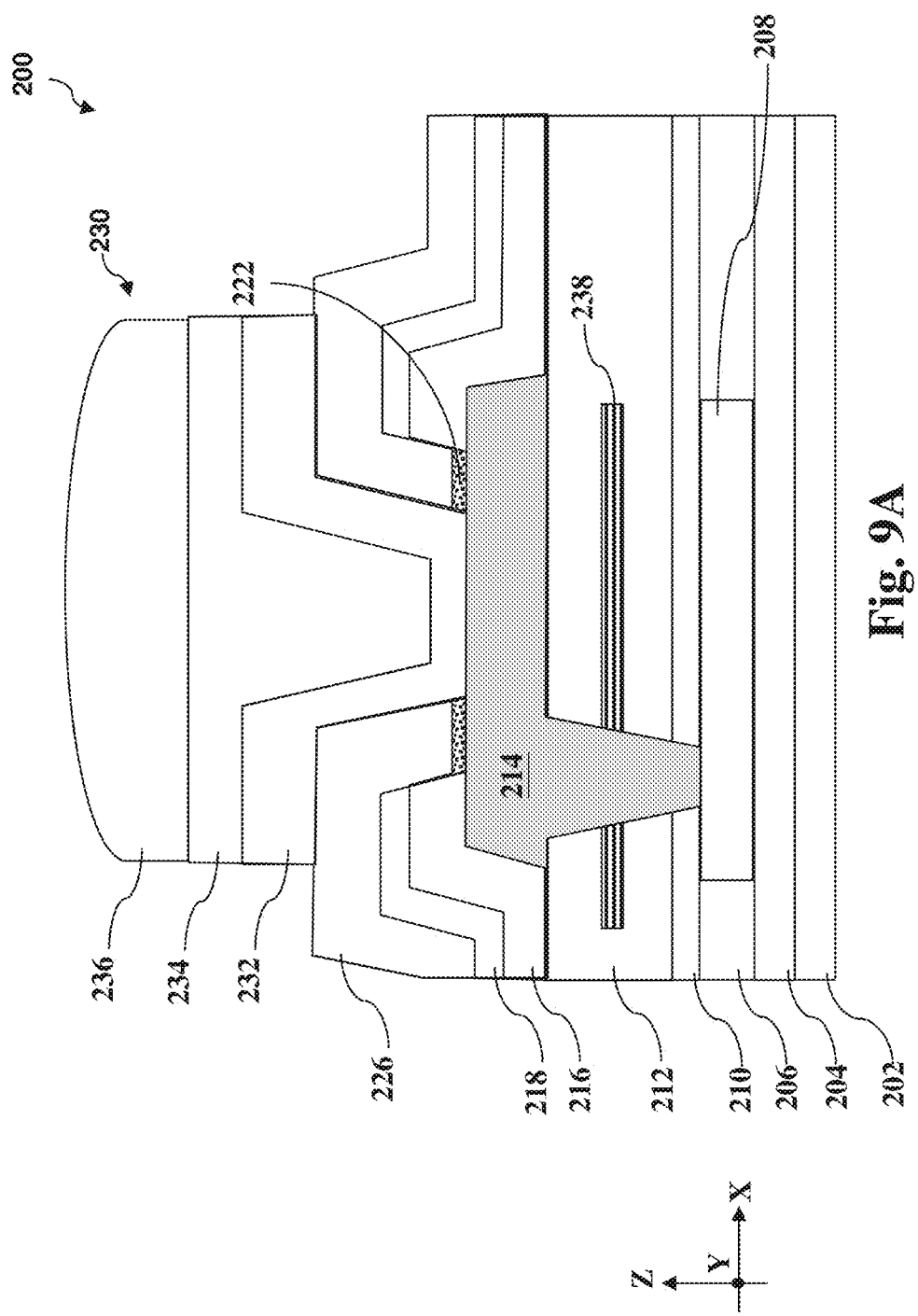
Figure 9B:
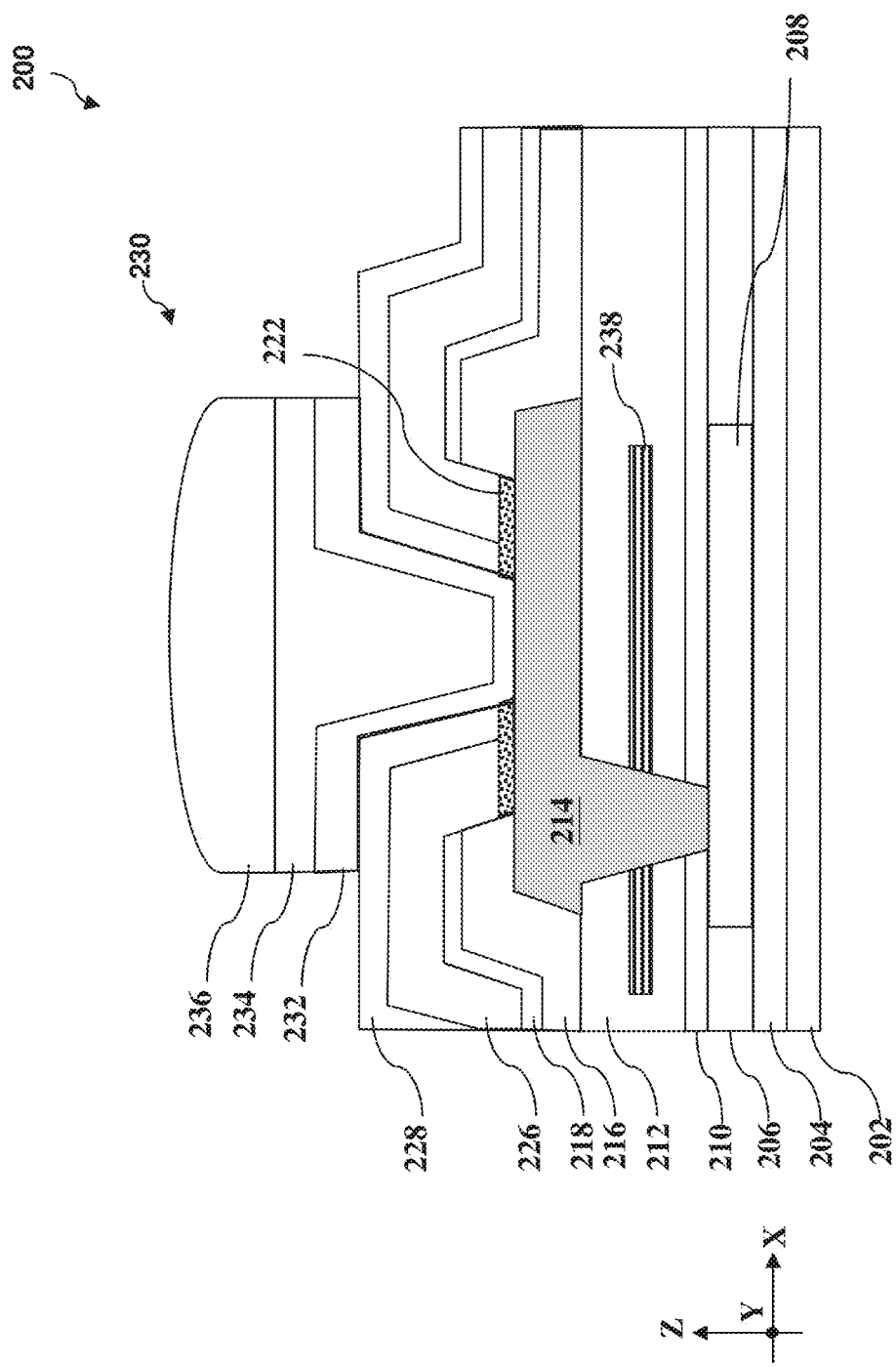
Figure 9C:
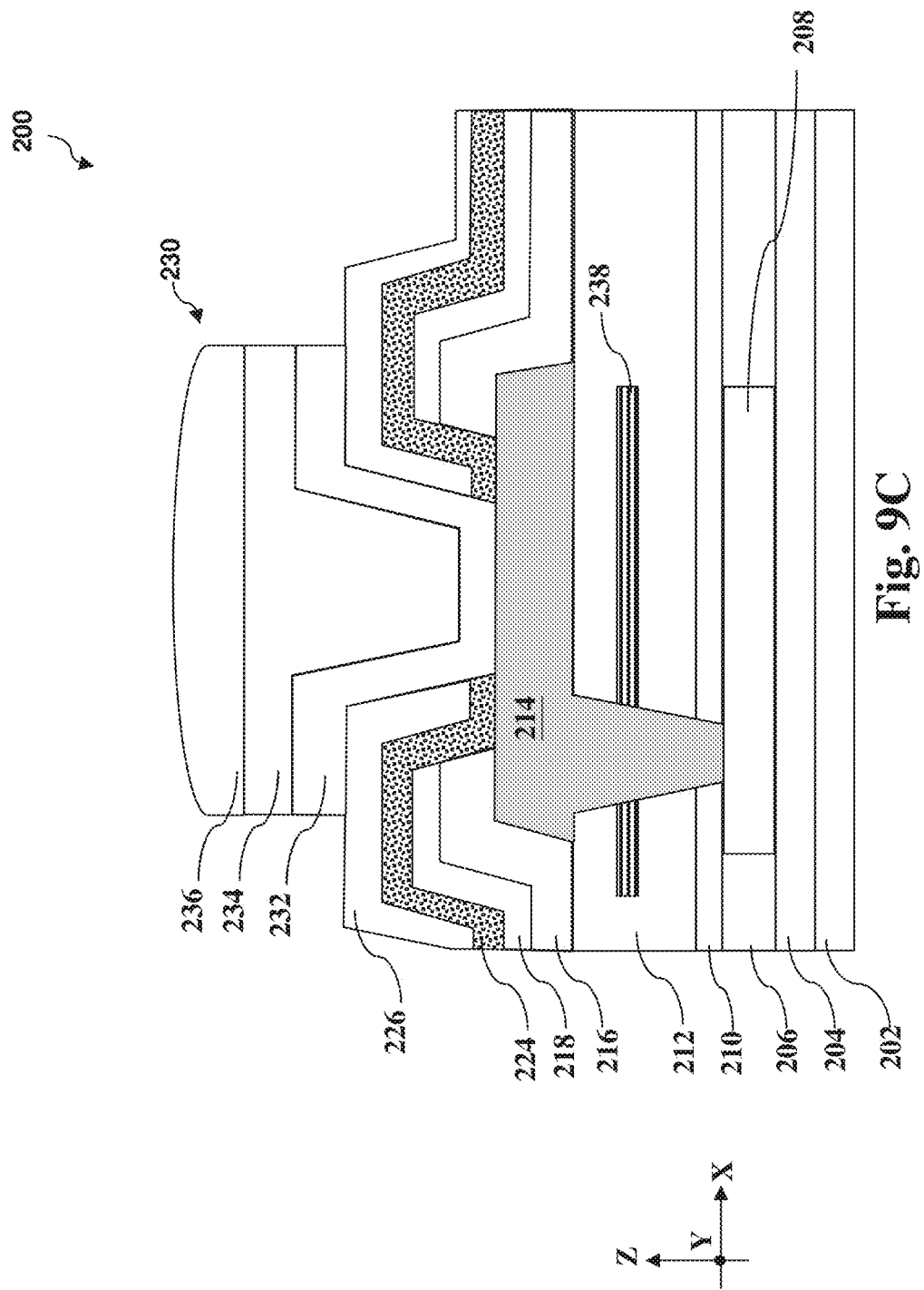
Figure 9D:
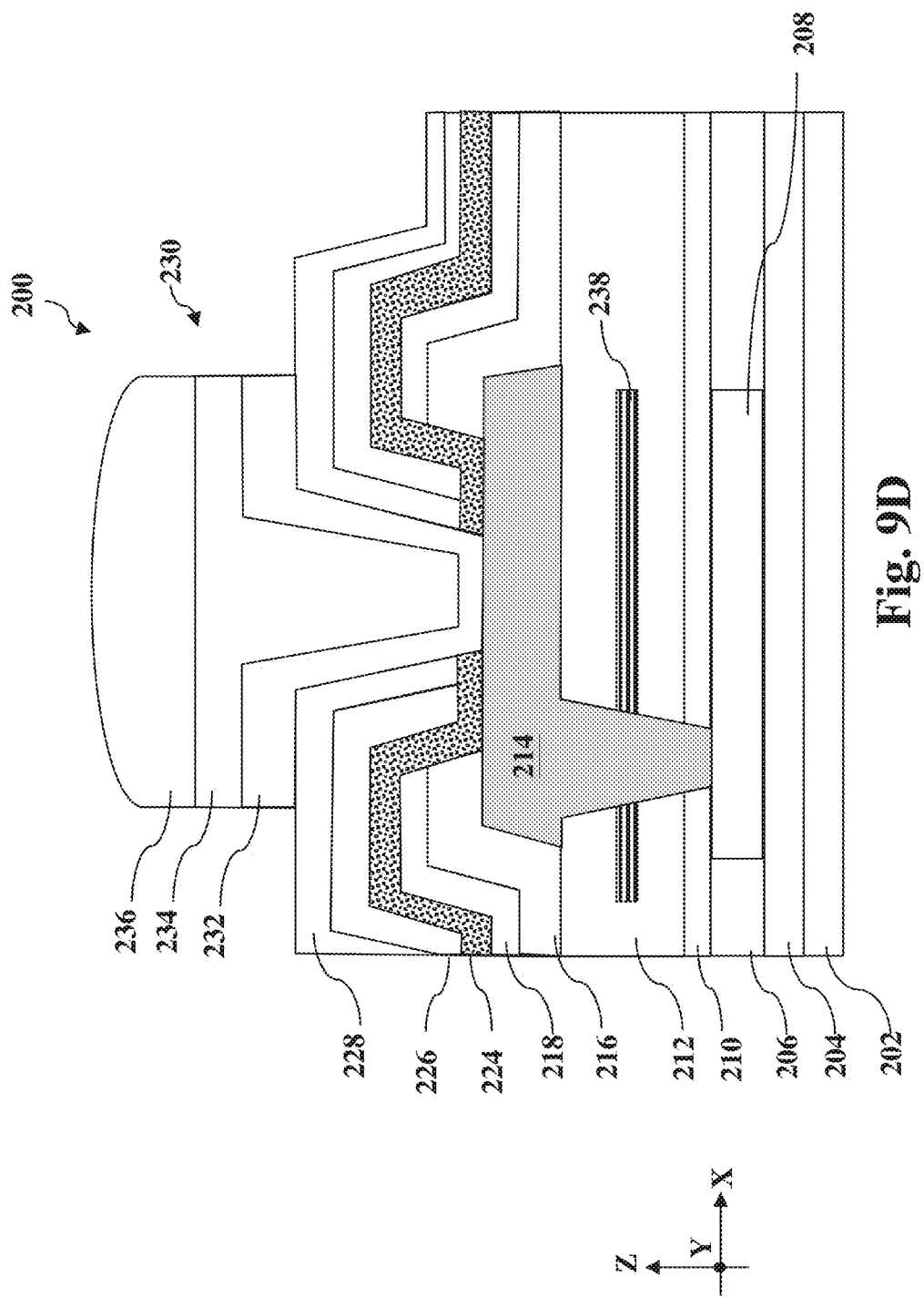

As shown in FIGS. 8A-8D, the bump feature 230 may be in contact with different layers in different exemplary embodiments of the present disclosure. Referring to FIG. 8A, the UBM layer 232 of the bump feature 230 is physically in contact with the first polymeric material 226 and the first protective layer 222. In some embodiments, the bump feature 230 is substantially circular when viewed along the Z direction. The bump feature 230 in FIG. 8A is laterally surrounded by the first polymeric material 226 and the first protective layer 222 on the X-Y plane. Referring to FIG. 8B where the second polymeric material 228 is formed, the UBM layer 232 of the bump feature 230 is physically in contact with the second polymeric material 228 and the first protective layer 222. In some embodiments, the bump feature 230 is substantially circular when viewed along the Z direction. The bump feature 230 in FIG. 8B is laterally surrounded by the second polymeric material 228 and the first protective layer 222 on the X-Y plane. Referring to FIG. 8C, the UBM layer 232 of the bump feature 230 is physically in contact with the first polymeric material 226 and the second protective layer 224. In some embodiments, the bump feature 230 is substantially circular when viewed along the Z direction. The bump feature 230 in FIG. 8C is laterally surrounded by the first polymeric material 226 and the second protective layer 224 on the X-Y plane. Referring to FIG. 8D where the second polymeric material 228 is formed, the UBM layer 232 of the bump feature 230 is physically in contact with the second polymeric material 228 and the second protective layer 224. In some embodiments, the bump feature 230 is substantially circular when viewed along the Z direction. The bump feature 230 in FIG. 8D is laterally surrounded by the second polymeric material 228 and the second protective layer 224 on the X-Y plane.

As illustrated in FIGS. 8A-8D, the metal pad 214 remains insulated from the first polymeric material 226 and the second polymeric material 228 by either the first protective layer 222 or the second protective layer 224 even after the bump feature 230 is formed. Referring to FIG. 8A, the remaining first protective layer 222 is disposed between the metal pad 214 and the first polymeric material 226. In FIG. 8B, the remaining first protective layer 222 is disposed between the metal pad 214, on the one hand, and the first polymeric material 226 and the second polymeric material 228, on the other. In FIG. 8C, the remaining second protective layer 224 is disposed between the metal pad 214 and the first polymeric material 226. In FIG. 8D, the remaining second protective layer 224 is disposed between the metal pad 214, on the one hand, and the first polymeric material 226 and the second polymeric material 228, on the other.

As described above in conjunction with FIG. 2, a metal-insulator-metal (MIM) structure 238 may be formed in the silicon oxide layer 212. Embodiments of the semiconductor devices 200 with an MIM structure 238 are shown in FIGS. 9A-9D. With the exception of the inclusion of the MIM structure 238, the semiconductor devices 200 in FIGS. 9A-9D are substantially similar to those shown in FIGS. 8A-8D. Detailed descriptions of FIGS. 9A-9D are omitted for brevity.

One aspect of the present disclosure involves a method. In one embodiment, the method includes depositing a first dielectric layer over a metal pad disposed over a workpiece, forming a first opening in the first dielectric layer to expose a portion of the metal pad, after the forming of the first opening, forming a second dielectric layer over the exposed portion of the metal pad, depositing a first polymeric material over the second dielectric layer, forming a second opening through the second dielectric layer to expose the metal pad, and forming a bump feature over the exposed metal pad.

In some embodiments, the depositing of the first dielectric layer includes depositing an undoped silica glass layer, depositing a silicon oxide layer using high-density plasma deposition chemic vapor deposition (HDPCVD), and depositing a silicon nitride layer. In some implementations, the metal pad includes aluminum. In some instances, the second dielectric layer includes silicon oxide or silicon nitride. In some embodiments, the forming of the second dielectric layer includes use of plasma-enhanced chemical vapor deposition (PECVD) or atomic layer deposition (ALD). In some instances, the depositing of the first polymeric material includes use of a monomer including fluorine or chlorine and the first polymeric material includes a polyimide. In some embodiments, the second dielectric layer includes a thickness between about 50 Å and about 200 Å. In some embodiments, the forming of the second dielectric layer includes treating the exposed portion of the metal pad with oxygen, nitrogen, or ammonia. In some instances, the second dielectric layer includes aluminum oxide or aluminum nitride.

One aspect of the present disclosure involves a method. In one embodiment, the method includes depositing a first dielectric layer over an aluminum-containing metal pad disposed over a workpiece, depositing a second dielectric layer over the first dielectric layer, forming a first opening through the first dielectric layer and the second dielectric layer to expose a first portion of the aluminum-containing metal pad, forming a protective layer of the first portion of the aluminum-containing metal pad, depositing a first polymeric material over the protective layer, the first polymeric material including fluorine, forming a second opening through the protective layer to expose a second portion of the aluminum-containing metal pad, and forming a bump feature over the exposed second portion of the aluminum-containing metal pad.

In some embodiments, the first dielectric layer includes silicon oxide. In some implementations, the second dielectric layer includes silicon nitride. In some instances, the protective layer includes silicon oxide or silicon nitride and the forming of the protective layer includes use of plasma-enhanced chemical vapor deposition (PECVD) or atomic layer deposition (ALD). In some embodiments, the forming of the protective layer includes treating the exposed first portion of the aluminum-containing metal pad with oxygen, nitrogen, or ammonia. In some instances, the protective layer includes oxide or aluminum nitride. In some embodiments, the first polymeric material includes a polyimide. In some instances, the method further includes depositing a second polymeric material over the first polymeric material prior to the forming of the second opening.

Another aspect of the present disclosure involves a semiconductor device. In one embodiment, the semiconductor device includes a metal pad over a substrate, a dielectric layer on the metal pad, a polymeric material over the dielectric layer, and a bump feature extending through the dielectric layer and the polymeric material and in direct contact with the metal pad. The polymeric material is spaced apart from the metal pad by the dielectric layer.

In some embodiments, the metal pad includes aluminum and the polymeric material includes fluorine or chlorine. In some implementations, a portion of bump feature is surrounded by the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   depositing a first dielectric layer over a metal pad disposed over a workpiece;
   forming a first opening in the first dielectric layer to expose a portion of the metal pad;
   after the forming of the first opening, forming a second dielectric layer over the exposed portion of the metal pad;
   depositing a first polymeric material over the second dielectric layer such that the first polymeric material is isolated from the metal pad;
   forming a second opening through the second dielectric layer to expose the metal pad; and
   forming a bump feature over the exposed metal pad,
   wherein the second dielectric layer comprises a metal oxide, a metal nitride, a semiconductor oxide, or a semiconductor nitride.

2. The method of claim 1,
   wherein the first dielectric layer comprises an undoped silica glass (USG) layer, a silicon oxide layer over the USG layer, and a silicon nitride layer over the silicon oxide layer, and
   wherein the depositing of the first dielectric layer comprises:
      depositing the USG layer,
      depositing the silicon oxide layer over the USG layer using high-density plasma deposition chemical vapor deposition (HDPCVD), and
      depositing the silicon nitride layer over the silicon oxide layer.

3. The method of claim 1, wherein the metal pad comprises aluminum.

4. The method of claim 1, wherein the second dielectric layer comprises silicon oxide or silicon nitride.

5. The method of claim 1, wherein the forming of the second dielectric layer comprises use of plasma-enhanced chemical vapor deposition (PECVD) or atomic layer deposition (ALD).

6. The method of claim 1,
   wherein the depositing of the first polymeric material comprises use of a monomer comprising fluorine or chlorine,
   wherein the first polymeric material comprises a polyimide.

7. The method of claim 1, wherein the second dielectric layer comprises a thickness between about 50 A and about 200 A.

8. The method of claim 1, wherein the forming of the second dielectric layer comprises:
   treating the exposed portion of the metal pad with oxygen, nitrogen, or ammonia.

9. The method of claim 8, wherein the second dielectric layer comprises aluminum oxide or aluminum nitride.

10. A method, comprising:
    depositing a first dielectric layer over an aluminum-containing metal pad disposed over a workpiece;
    depositing a second dielectric layer over the first dielectric layer;
    forming a first opening through the first dielectric layer and the second dielectric layer to expose a first portion of the aluminum-containing metal pad;
    forming a protective layer on the first portion of the aluminum-containing metal pad;
    depositing a first polymeric material over the protective layer, the first polymeric material comprising fluorine;
    forming a second opening through the protective layer to expose a second portion of the aluminum-containing metal pad; and
    forming a bump feature over the exposed second portion of the aluminum-containing metal pad.

11. The method of claim 10, wherein the first dielectric layer comprises silicon oxide.

12. The method of claim 11, wherein the second dielectric layer comprises silicon nitride.

13. The method of claim 10,
    wherein the protective layer comprises silicon oxide or silicon nitride,
    wherein the forming of the protective layer comprises use of plasma-enhanced chemical vapor deposition (PECVD) or atomic layer deposition (ALD).

14. The method of claim 10, wherein the forming of the protective layer comprises:
treating the exposed first portion of the aluminum-containing metal pad with oxygen, nitrogen, or ammonia.

15. The method of claim 14, wherein the protective layer comprises aluminum oxide or aluminum nitride.

16. The method of claim 10, wherein the first polymeric material comprises a polyimide.

17. The method of claim 10, further comprising depositing a second polymeric material over the first polymeric material prior to the forming of the second opening.

18. A semiconductor device, comprising:
a metal pad over a substrate;
a first dielectric layer disposed directly on the metal pad;
a second dielectric layer disposed over the first dielectric layer;
a polymeric material disposed over the first dielectric layer, the second dielectric layer and the metal pad such that the polymeric material is in direct contact with sidewalls of the first dielectric layer and the second dielectric layer; and
a bump feature extending through the polymeric material and in direct contact with the metal pad and the polymeric material,
wherein the polymeric material is spaced apart from a top surface of the metal pad by a dielectric protective layer,
wherein the dielectric protective layer and the metal pad share a metal element.

19. The semiconductor device of claim 18,
wherein the metal pad comprises aluminum,
wherein the dielectric protective layer comprises aluminum oxide or aluminum nitride,
wherein the polymeric material comprises fluorine or chlorine.

20. The semiconductor device of claim 19, wherein the bump feature is spaced apart from the first dielectric layer and the second dielectric layer by the polymeric material.

* * * * *